(12) United States Patent
Zhang et al.

(10) Patent No.: US 10,135,020 B1
(45) Date of Patent: Nov. 20, 2018

(54) ORGANIC LIGHT-EMITTING DISPLAY PANEL, METHOD FOR MAKING THE SAME, AND ORGANIC LIGHT-EMITTING DISPLAY DEVICE

(71) Applicant: SHANGHAI TIANMA AM-OLED CO., LTD., Shanghai (CN)

(72) Inventors: Peng Zhang, Shanghai (CN); Congyi Su, Shanghai (CN); Gang Liu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/862,613

(22) Filed: Jan. 4, 2018

(30) Foreign Application Priority Data

Jul. 28, 2017 (CN) .......................... 2017 1 0631166

(51) Int. Cl.
   *H01L 27/32* (2006.01)
   *H01L 51/52* (2006.01)
   *H01L 27/02* (2006.01)

(52) U.S. Cl.
   CPC ...... *H01L 51/5237* (2013.01); *H01L 27/0248* (2013.01); *H01L 27/3225* (2013.01); *H01L 27/3246* (2013.01); *H01L 51/5203* (2013.01); *H01L 51/5253* (2013.01)

(58) Field of Classification Search
   CPC ................................ H01L 27/30; H01L 51/10
   See application file for complete search history.

(56) References Cited

U.S. PATENT DOCUMENTS

2015/0270287 A1\* 9/2015 Kim ...................... H01L 27/124
                                                                257/40

FOREIGN PATENT DOCUMENTS

| CN | 102315211 A | 1/2012 |
| CN | 105144418 A | 12/2015 |

\* cited by examiner

*Primary Examiner* — Cheung Lee
(74) *Attorney, Agent, or Firm* — Kilpatrick Townsend & Stockton LLP

(57) ABSTRACT

Provided are organic light-emitting display panel, making method and display device. The display panel includes an array substrate including a display area and a non-display area, an organic light-emitting member and a encapsulation layer. A first buffer layer, a first and second insulation layer are placed in the non-display area; an antistatic ring is placed between the first and second insulation layers; a second buffer layer, a polysilicon layer, a gate insulation layer, a gate metallic layer, third and fourth insulation layers, a capacitor metallic layer, a source-drain metallic layer and a planarization layer are in the display area. The second and first buffer layers are made in a same process, the third and first insulation layers are made in a same process, the fourth and second insulation layers are made in a same process, and the antistatic ring and the gate metallic layer are made in a same process.

20 Claims, 15 Drawing Sheets

ORGANIC LIGHT-EMITTING DISPLAY PANEL, METHOD FOR MAKING THE SAME, AND ORGANIC LIGHT-EMITTING DISPLAY DEVICE

CROSS-REFERENCE TO RELATED APPLICATIONS

The present application claims the benefit of priority to Chinese Patent Application No. 201710631166.7, filed on Jul. 28, 2017, the content of which is incorporated herein by reference in its entirety.

TECHNICAL FIELD

The present disclosure relates to the field of display technologies and, particularly, to an organic light-emitting display panel, a method for making the organic light-emitting display panel, and an organic light-emitting display device.

BACKGROUND

With the booming development of flat display technologies, an organic light-emitting display (OLED) panel becomes more and more popular because of its advantages of self-illumination, high brightness, wide viewing angle, and short response time.

In the conventional art, an organic light-emitting display panel includes an array substrate, a plurality of organic light-emitting diodes placed on the array substrate, and a encapsulation layer placed on one side of the organic light-emitting diodes away from the array substrate and covering the organic light-emitting diodes.

In a process of making the above-mentioned structures and using the OLED panel, static electricity is generated and transmitted to an electrode layer of an organic light-emitting member, which damages the organic light-emitting member, and thus cause adverse influence on display of an organic light-emitting display panel.

SUMMARY

Embodiments of the present disclosure provide an organic light-emitting display panel, a method for making the organic light-emitting display panel, and an organic light-emitting display device, which can prevent an antistatic ring from electrically connecting with an electrode layer of an organic light-emitting member, and can prevent adverse effects of the static electricity on the display of the organic light-emitting display panel.

In a first aspect, the present disclosure provides a An organic light-emitting display panel, comprising: an array substrate; an organic light-emitting member, placed on the array substrate; and a encapsulation layer, placed on a side of the organic light-emitting member away from the array substrate and covering the organic light-emitting member; wherein the array substrate comprises a flexible substrate, and the flexible substrate comprises a display area and a non-display area surrounding the display area; the array substrate further comprises a first buffer layer, a first insulation layer, a second insulation layer, and an antistatic ring, wherein the first buffer layer, the first insulation layer, and the second insulation layer are sequentially placed in the non-display area along a direction away from flexible substrate, the antistatic ring is placed between the first buffer layer and the first insulation layer, an extending direction of the antistatic ring is a circumferential direction of the non-display area, and the antistatic ring is non-closed in the extending direction; the array substrate further comprises a second buffer layer, a polysilicon layer, a gate insulation layer, a gate metallic layer, a third insulation layer, a capacitor metallic layer, a fourth insulation layer, a source-drain metallic layer, and a planarization layer, wherein the second buffer layer, the polysilicon layer, the gate insulation layer, the gate metallic layer, the third insulation layer, the capacitor metallic layer, the fourth insulation layer, the source-drain metallic layer, and the planarization layer are sequentially placed in the display area of the flexible substrate along a direction toward the organic light-emitting member; wherein the second buffer layer and the first buffer layer are made in a same process, the third insulation layer and the first insulation layer are made in a same process, the fourth insulation layer and the second insulation layer are made in a same process, and the antistatic ring and the gate metallic layer are made in a same process.

In a second aspect, the present disclosure provides an organic light-emitting display device comprising the organic light-emitting display panel as described above.

In a third aspect, the present disclosure provides method for making an organic light-emitting display panel, comprising steps of: making an array substrate; forming a plurality of organic light-emitting members on the array substrate made; and making a encapsulation layer, wherein the encapsulation layer is placed at a side of the plurality of organic light-emitting members away from the array substrate and covers the plurality of organic light-emitting members; wherein the step of making the array substrate comprises steps of: providing a flexible substrate, wherein the flexible substrate comprises a display area and a non-display area surrounding the display area; sequentially forming a first buffer layer, an antistatic ring, a first insulation layer, and a second insulation layer in the non-display area of the flexible substrate, wherein an extending direction of the antistatic ring is a circumferential direction of the non-display area, and the antistatic ring is non-closed in the extending direction; and sequentially forming a second buffer layer, a polysilicon layer, a gate insulation layer, a gate metallic layer, a third insulation layer, a capacitor metallic layer, a fourth insulation layer, a source-drain metallic layer, and a planarization layer in the display area of the flexible substrate; wherein the second buffer layer and the first buffer layer are made in a same process, the third insulation layer and the first insulation layer are made in a same process, the fourth insulation layer and the second insulation layer are made in a same process, and the antistatic ring and the gate metallic layer are made in a same process.

BRIEF DESCRIPTION OF DRAWINGS

The following accompanying drawings are merely some illustrative embodiments of the present disclosure.

DESCRIPTION OF EMBODIMENTS

Figure 1:
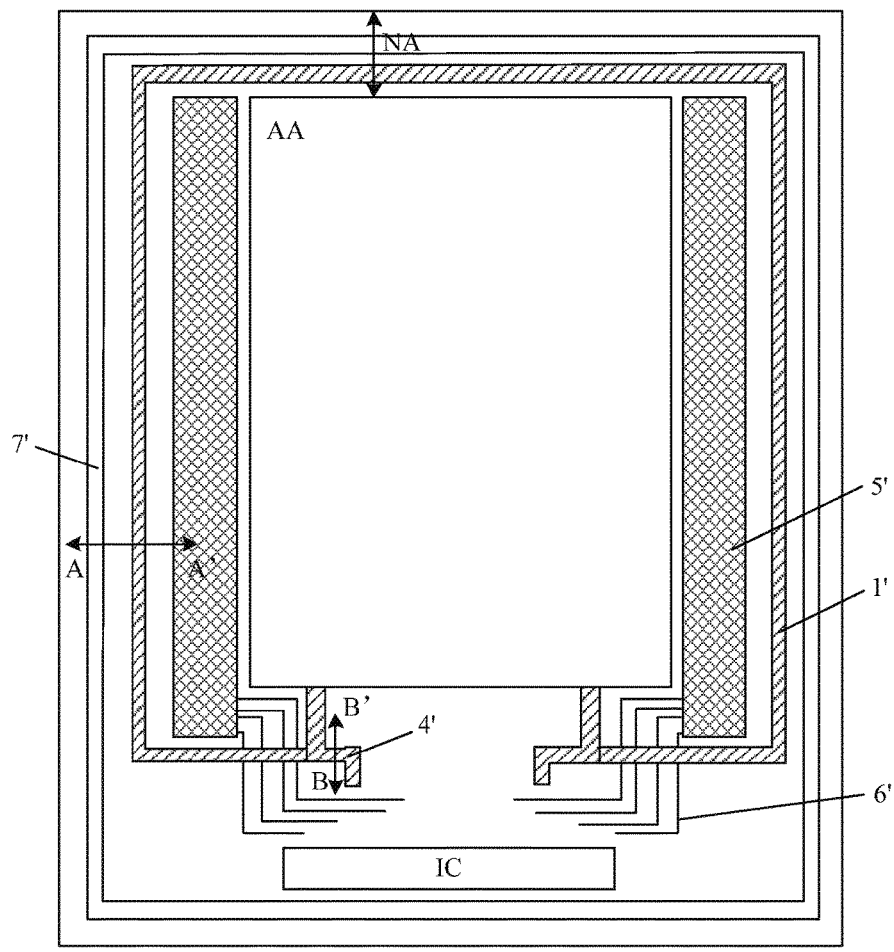
FIG. 1 is a top view of an organic light-emitting display panel.

As shown in FIG. 1, which is a top view of an OLED panel, the OLED panel further includes an antistatic ring 1'. The antistatic ring 1' is placed in an area NA surrounding the OLED panel.

Figure 2:
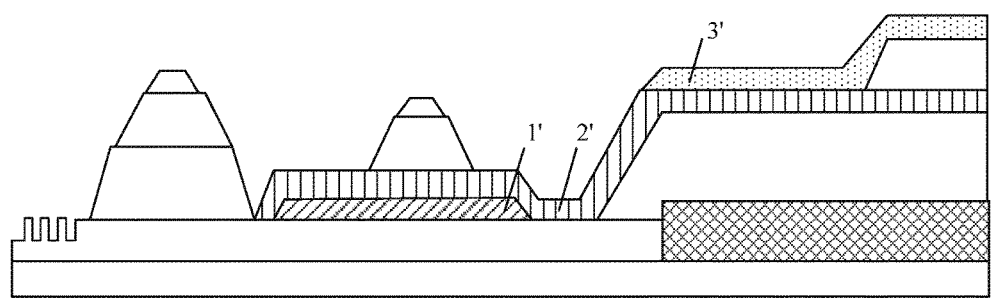
FIG. 2 is a cross-sectional schematic view along direction A-A' in FIG. 1.
Figure 3:
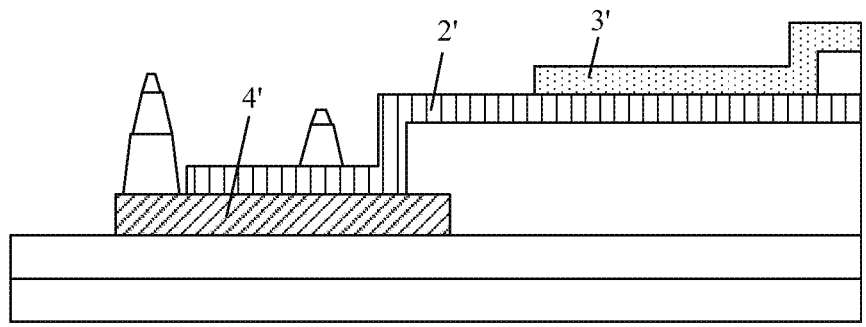
FIG. 3 is another cross-sectional schematic view along direction B-B' in FIG. 1.

The inventor has found that, the existing antistatic ring 1' is formed by a source-drain metallic layer on the array substrate. As shown in FIG. 2, which is a cross-sectional view along direction A-A' in FIG. 1, the antistatic ring 1' is indirectly electrically connected with a cathode 3' of the organic light-emitting diode at a left border, a right border, and a top border (FIG. 2 only shows the left border for example) by an anode 2' of the organic light-emitting diode. As shown in FIG. 3, which is a cross-sectional view along direction B-B' in FIG. 1, the antistatic ring 1' at a bottom border is electrically connected with a cathode wiring 4' in the same layer where the antistatic ring 1' is located, and the cathode wiring 4' is also indirectly electrically connected with the cathode 3' of the organic light-emitting diode by the anode 2' of the organic light-emitting diode. Therefore, in a process of conducting away the static electricity by the antistatic ring 1', electrostatic may be conducted to the cathode 3' by the anode 2', and then the organic light-emitting diodes may be damaged by electrostatic, which affects the display of the organic light-emitting display panel.

To solve a technical problem that static electricity is transmitted to an electrode layer of an organic light-emitting member, damages the organic light-emitting member, and thus cause adverse influence on display of an organic light-emitting display panel, the inventor provides solutions as follows:

It should be noted that, the solutions as follows are based on organic light-emitting display panels with structures described as below. As shown in FIG. 1, the organic light-emitting display panel includes a display area AA and a non-display area NA surrounding the display area AA. A plurality of organic light-emitting members (not shown in FIG. 1) is placed in the display area AA, and an antistatic ring 1', an integrated circuit IC, two gate drive circuits 5', and two groups of test wirings 6' are placed in the non-display area NA. The integrated circuit IC is located in a bottom portion of the non-display area NA, the two gate drive circuits 5' are located in left and right portions of the non-display area NA, respectively, and the test wirings 6' are located in the bottom portion of the non-display area NA and connected with the two gate drive circuits 5', respectively. In addition, a peripheral structure 7' is placed in a portion of the non-display area NA away from the display area AA. The peripheral structure 7' is formed by stacking up a film layer where a buffer layer is located, a film layer where an inter-metal dielectric (IMD) layer is located, and a film layer where an interlayer dielectric layer.

Figure 4:
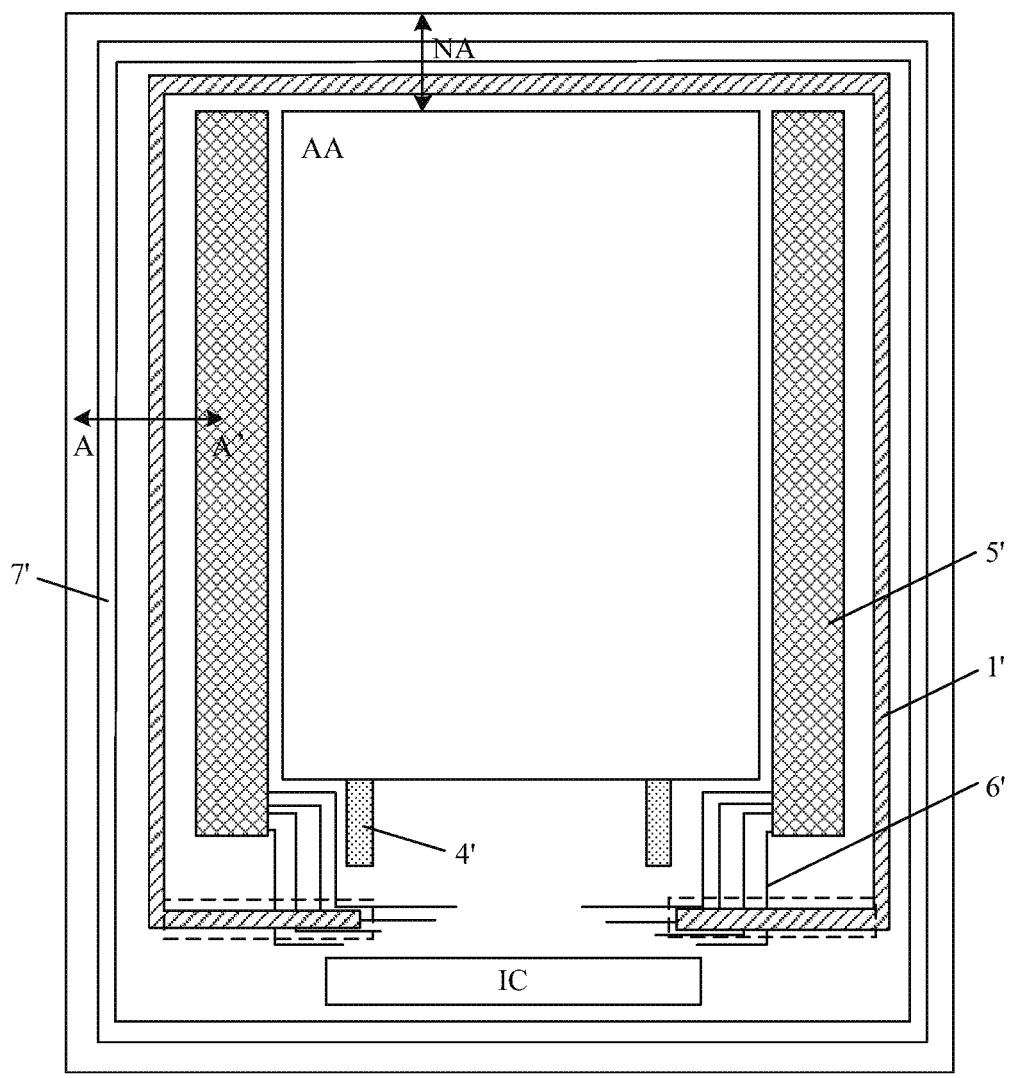
FIG. 4 is a top view of an organic light-emitting display panel according to an embodiment of the present disclosure.
Figure 5:
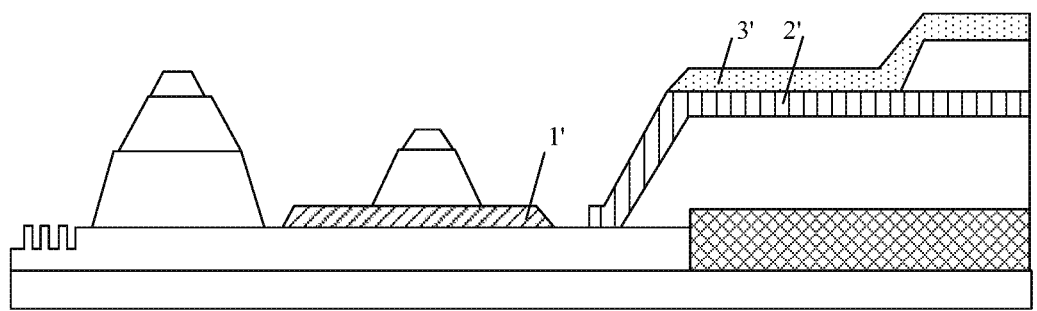
FIG. 5 is a cross-sectional schematic view along direction A-A' in FIG. 4 according to an embodiment of the present disclosure.

In one embodiment, compared with that shown in FIG. 1, as shown in FIG. 4, which is a top view of an organic light-emitting display panel, a portion of the antistatic ring 1' located on the bottom of the non-display area NA (portion in a dotted box in FIG. 4) is moved away from the display area AA, and to a position of an incoming end of the test wiring 6', as shown in FIG. 5, so that a covering range on a anode 2' in the top, left, and right of the non-display area NA is decreased, and the anode 2' is not electrically connected with the antistatic ring 1' (may only take the left border for example in FIG. 5). With such structure, the above-mentioned problem can be solved, but since the test wirings 6' and the antistatic ring 1' are not in a same metallic layer, and their extending directions are different, their orthographic projections may overlap. Thus, at a position where their orthographic projections overlap, a distance between them is small, and then electrostatic on the antistatic ring 1' causes damage to the test wirings 6'.

Figure 6:
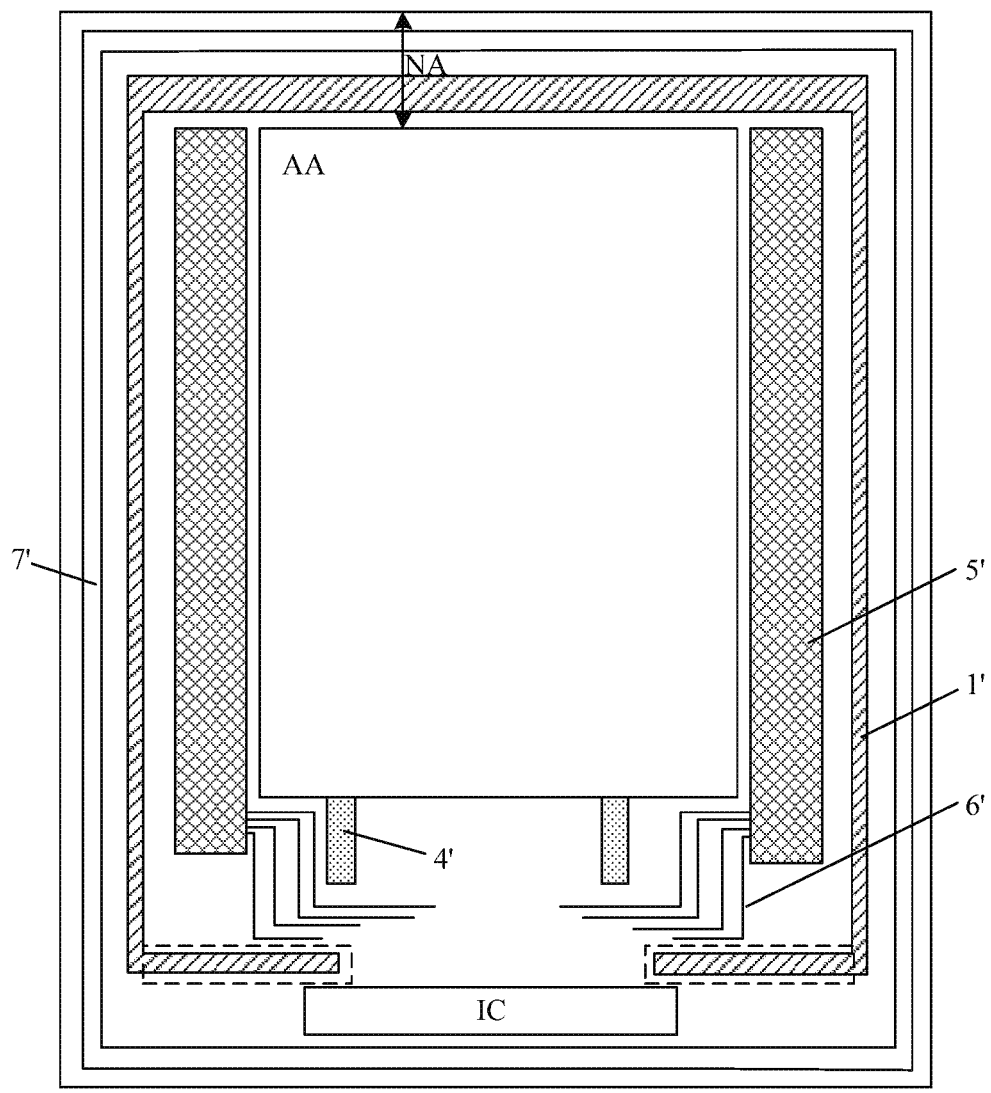
FIG. 6 is a top view of another organic light-emitting display panel according to an embodiment of the present disclosure

In another embodiment, compared with that shown in FIG. 1, as shown in FIG. 6, which is a top view of another organic light-emitting display panel, a portion of the antistatic ring 1' located on the bottom portion of the non-display area NA where the integrated circuit IC is located (portion in a dotted box in FIG. 6) is moved away from the display area AA to a position between the test wirings 6' and the peripheral structure 7'. A structure of the anode 2' located in the top, left, and right portions of the non-display area NA is the same as the structure of the anode 2' in the first solution, which is not repeated herein. With such structure, the above-mentioned problem can be solved, but, since a space in that position is small, a width of the antistatic ring 1' may be small. However, on the other hand, for electrostatic shielding, a size and a width of the antistatic ring 1' should not be too small. In addition, a certain distance should be kept between the antistatic ring 1' and an internal circuit for protecting the internal circuit from electrostatic damage. Thus, in order to satisfy the shielding effect, it is inappropriate to move the antistatic ring 1' to an area between the test wirings 6' and the peripheral structure 7'.

Figure 7:
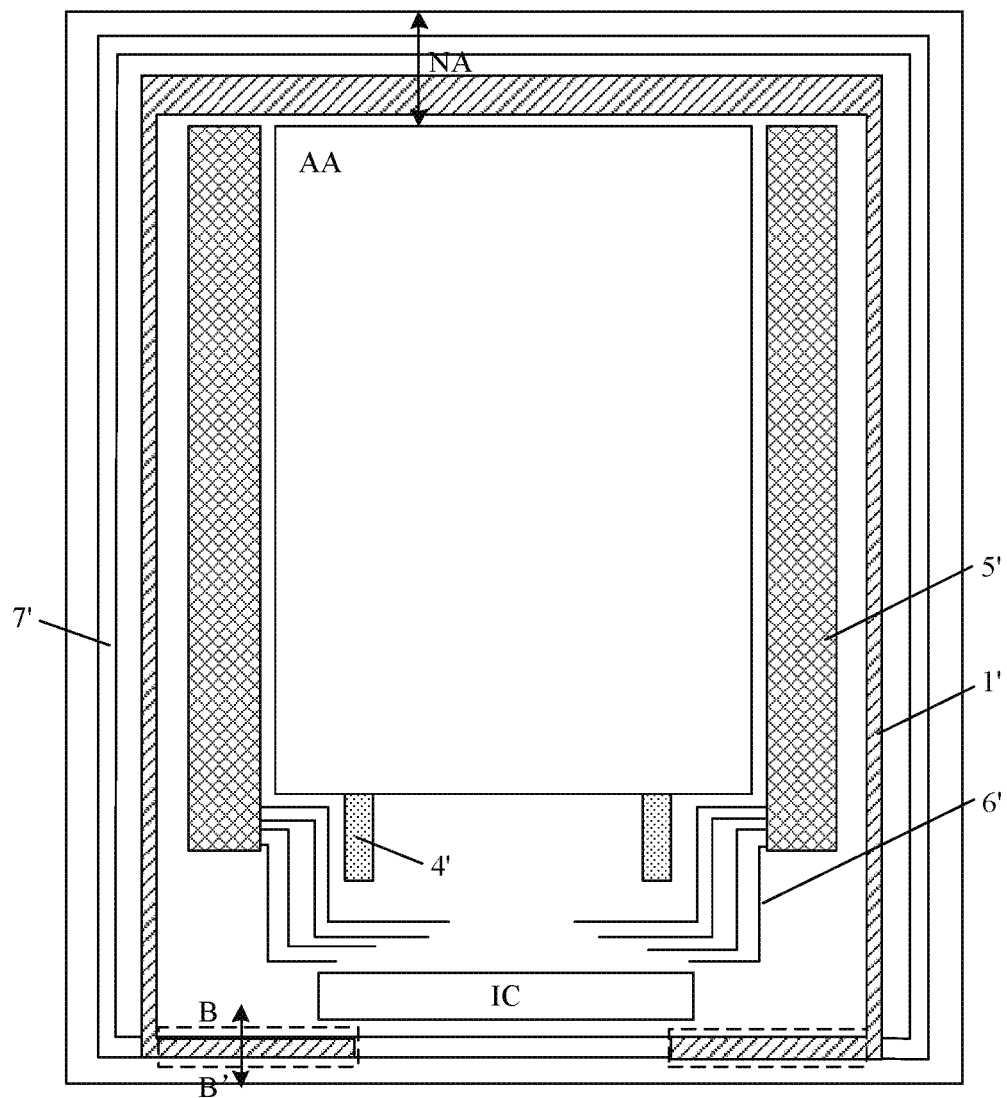
FIG. 7 is a top view of still another organic light-emitting display panel according to an embodiment of the present disclosure.
Figure 8:
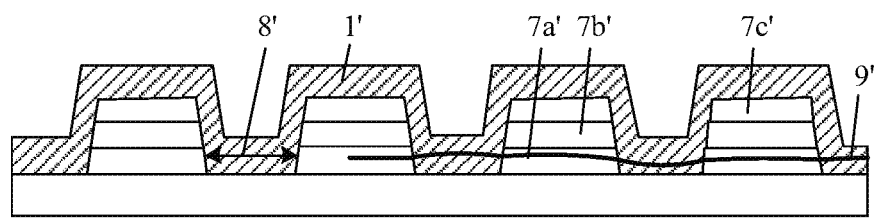
FIG. 8 is a cross-sectional schematic view along direction B-B' in FIG. 7 according to an embodiment of the present disclosure.

In yet another embodiment, compared with that shown in FIG. 1, as shown in FIGS. 7 and 8 respectively showing a top view of still another organic light-emitting display panel and a cross-sectional schematic view taken along direction B-B' in FIG. 7, a portion of the antistatic ring 1' located on in the bottom portion of the non-display area NA where the integrated circuit IC is located (i.e., a portion in a dotted box in FIG. 7) is moved away from the display area AA onto the peripheral structure 7'. A structure of the anode 2' located in the top, left, and right portions of the non-display area NA is the same as the structure of the anode 2' in the first solution, which is not repeated herein. With such structure, the above-mentioned problem can be solved, but, as shown in FIG. 8, since a plurality of grooves 8' may be defined in an area where the peripheral structure 7 is located, for preventing a cutting crack from extending, and the antistatic ring 1' is made of a source-drain metallic layer located on the film layer 7a' where the buffer layer is located, the film layer 7b' where the IMD is located, and the film layer 7c' where the ILD is located of the peripheral structure 7', so that the antistatic ring 1' will surely cover the grooves 8', thus, if a crack 9' exist in that area, the crack 9' may extend along the antistatic ring 1' covering internal bottom surfaces of the grooves 8', which may cause the antistatic ring 1' to crack. Thus, a resistance of the antistatic ring 1' may be increased, the electrostatic shielding effect is bad, and a function of the area for preventing the crack extending may be weakened.

Figure 9:
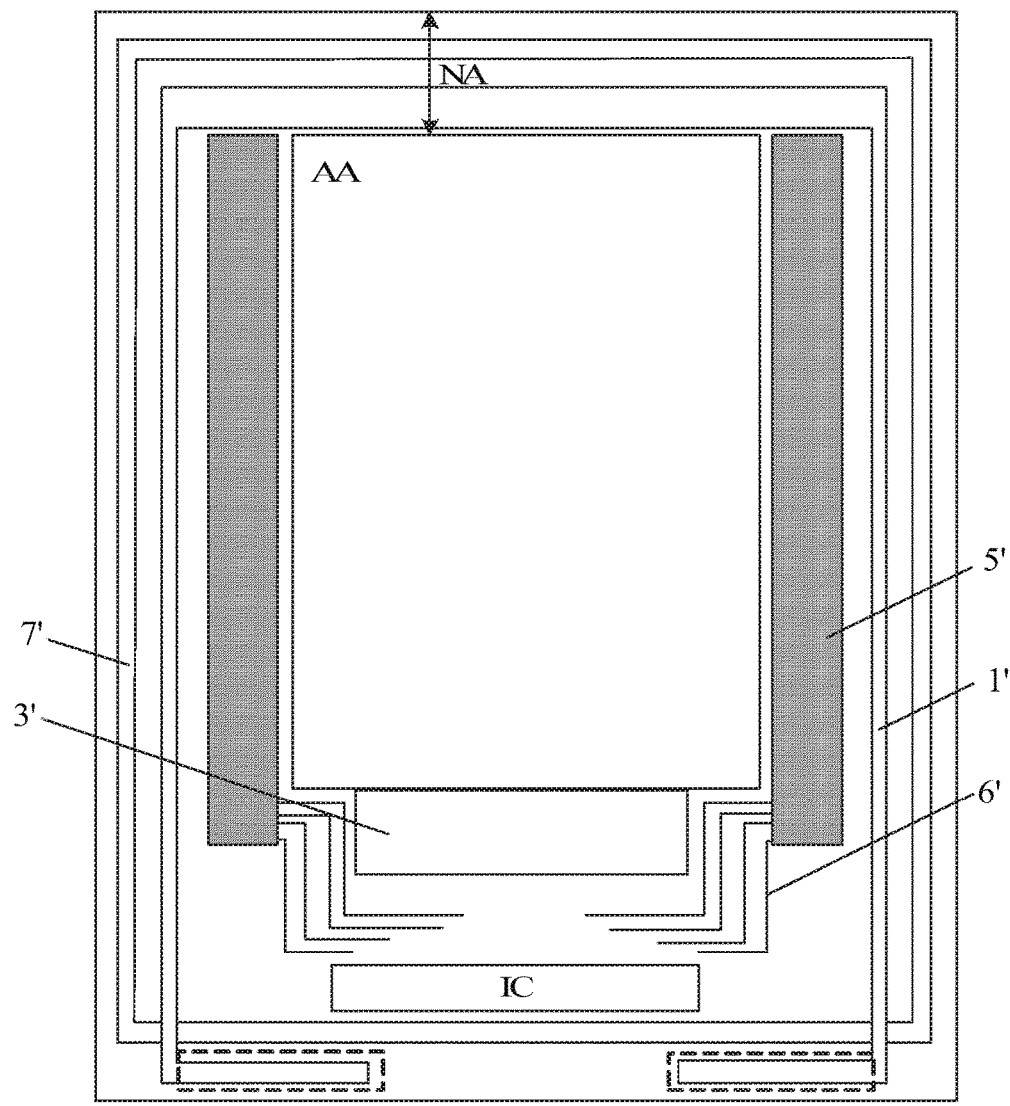
FIG. 9 is a top view of still another organic light-emitting display panel according to an embodiment of the present disclosure.

In still another embodiment, compared with that as shown in FIG. 1, as shown in FIG. 9 showing a top view of still another organic light-emitting display panel, a portion of the antistatic ring 1' located on the bottom portion of the non-display area NA where the integrated circuit IC is located (i.e., a portion in a dotted box in FIG. 9) is moved away from the display area AA to a side of the peripheral structure 7' away from the display area AA. A structure of the anode 2' located in top, left, and right portions of the non-display area NA is the same as the structure of the anode 2' in the first solution, which is not repeated herein. With such structure, the above-mentioned problem can be solved, but a border of the organic light-emitting display panel may be widened, which makes against narrowing of the border. In addition, an area where the antistatic ring 1' is located coincides with a cutting area, when cutting, the antistatic ring 1' may be cut, and then lose the function of electrostatic shielding.

Figure 10:
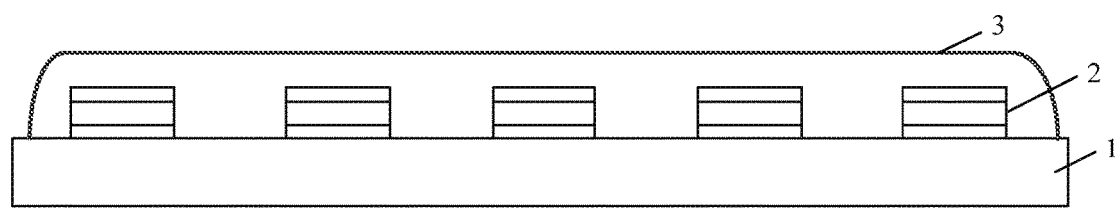
FIG. 10 is a cross-sectional schematic view of an organic light-emitting display panel according to an embodiment of the present disclosure.

After careful consideration and research, the inventor of the present disclosure provides technical solutions in the embodiments of the present disclosure. As shown in FIG. 10, which is a cross-sectional schematic view of the organic light-emitting display panel according to an embodiment of the present disclosure, the organic light-emitting display panel includes an array substrate 1, an organic light-emitting member 2 placed on the array substrate 1, and a encapsulation layer 3 placed on a side of the organic light-emitting member 2 away from the array substrate 1 and covering the organic light-emitting member 2.

Figure 11:
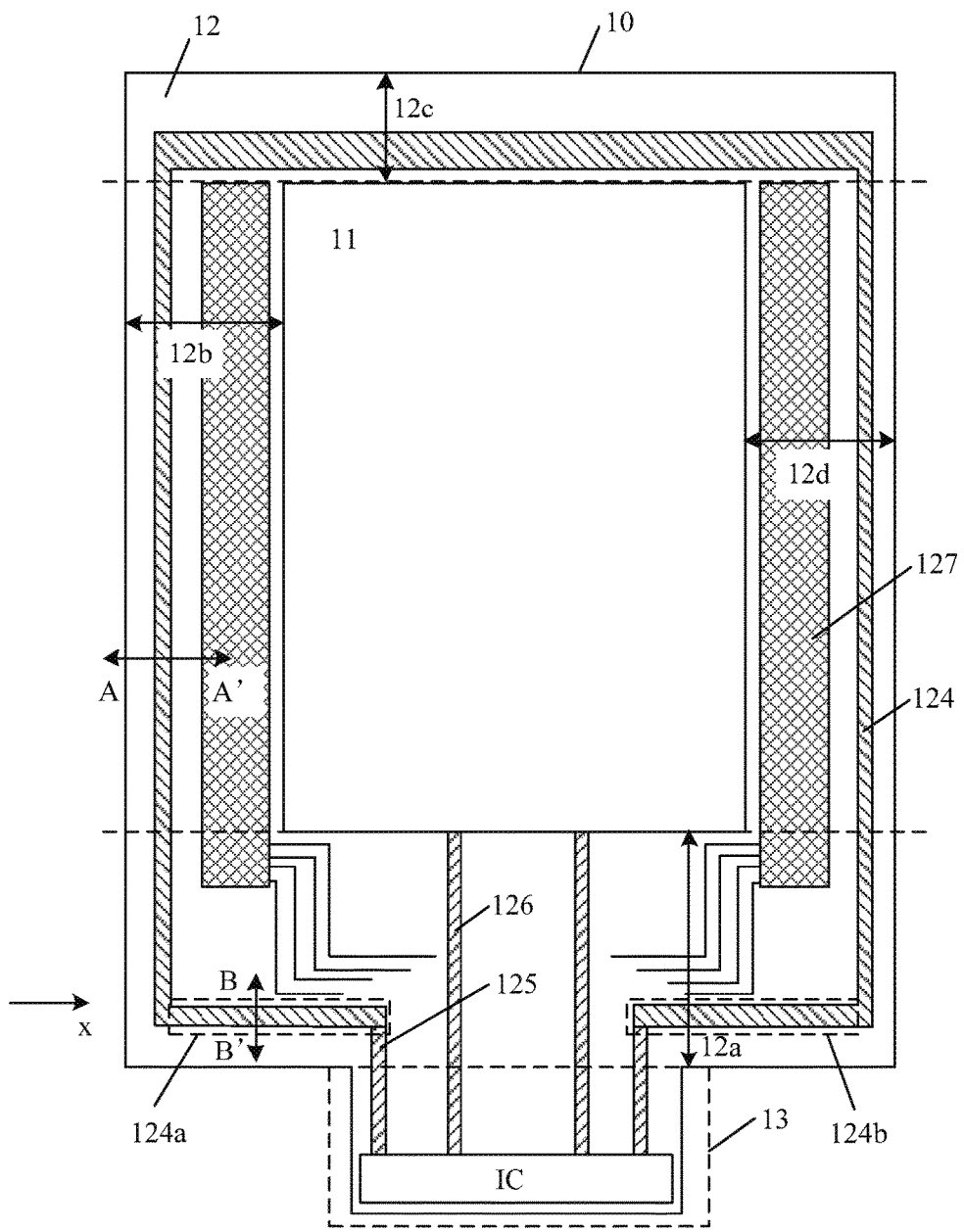
FIG. 11 is a top view of still another organic light-emitting display panel according to an embodiment of the present disclosure.
Figure 12:
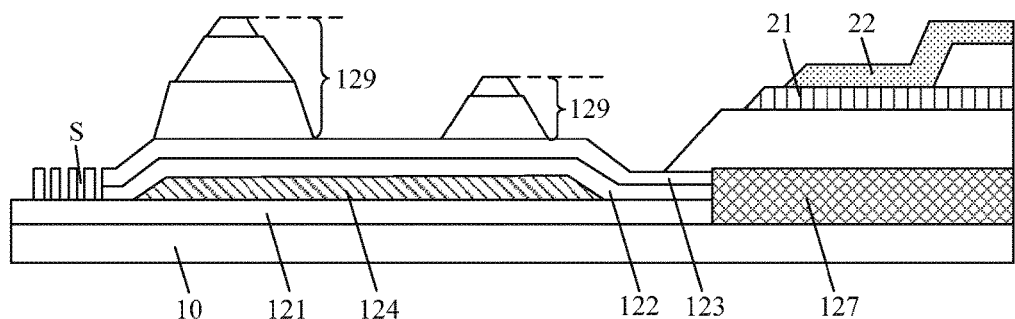
FIG. 12 is a cross-sectional schematic view along direction A-A' in FIG. 11 according to an embodiment of the present disclosure.
Figure 13:
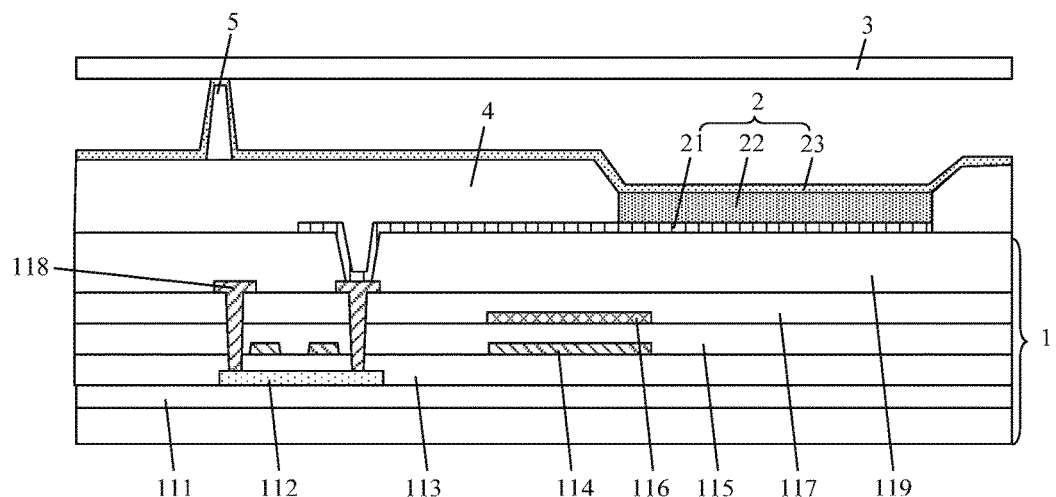
FIG. 13 is a cross-sectional schematic view of a display area of an organic light-emitting display panel according to an embodiment of the present disclosure.

Further, as shown in FIG. 11, which is a top view of another organic light-emitting display panel according to an embodiment of the present disclosure, the array substrate 1 includes a flexible substrate 10. The flexible substrate 10 includes a display area 11 and a non-display area 12 surrounding the display area 11. FIG. 12 is a cross-sectional schematic view along direction A-A' in FIG. 11. In one embodiment as shown in FIGS. 11 and 12, the array substrate 1 further includes a first buffer layer 121, a first insulation layer 122, and a second insulation layer 123. The first buffer layer 121, the first insulation layer 122, and the second insulation layer 123 are sequentially placed on the non-display area 12 along a direction away from the flexible substrate 10. The antistatic ring 124 is placed between the first buffer layer 121 and the first insulation layer 122. An extending direction of the antistatic ring 124 is a circumferential direction of the non-display area 12, and the antistatic ring 124 is non-closed in its extending direction. FIG. 13 is a cross-sectional schematic view of the display area of the organic light-emitting display panel according to an embodiment of the present disclosure. As shown in FIGS. 11 and 13, the array substrate 1 further includes a second buffer layer 111, a polysilicon layer 112, a gate insulation layer 113, a gate metallic layer 114, a third insulation layer 115, a capacitor metallic layer 116, a fourth insulation layer 117, a source-drain metallic layer 118, and a planarization layer 119. The second buffer layer 111, the polysilicon layer 112, the gate insulation layer 113, the gate metallic layer 114, the third insulation layer 115, the capacitor metallic layer 116, the fourth insulation layer 117, the source-drain metallic layer 118, and the planarization layer 119 are sequentially placed in the display area 11 along a direction toward the organic light-emitting member 2.

As shown in FIGS. 12 and 13, the second buffer layer 111 and the first buffer 121 are made in a same process, the third insulation layer 115 and the first insulation layer 122 are made in a same process, the fourth insulation layer 117 and the second insulation layer 123 are made in a same process, and the antistatic ring 124 and the gate metallic layer 114 are made in a same process. The film layer where the third insulation layer 115 and the first insulation layer 122 are located can also be called as an IMD layer, and the film layer where the fourth insulation layer 117 and the second insulation layer 123 are located can also be called as an ILD layer.

It is known by the above description that, along a direction perpendicular to the flexible substrate 10, the antistatic ring 124 is spaced from the organic light-emitting member 2 by a plurality of insulation layers (at least including the film layer where the third insulation layer 115 and the first insulation layer 122 are located and the film layer where the fourth insulation layer 117 and the second insulation layer 123 are located). Thus, the antistatic ring 124 is prevented from electrically connecting with an electrode layer of the organic light-emitting member 2, static electricity on the antistatic ring 124 won't make damage to the organic light-emitting member 2, and then an adverse influence of the static electricity on display of the organic light-emitting display panel can be avoided.

In addition, the antistatic ring 124 with such an arrangement can effectively prevent new technical problems in the above-described four solutions. The reason is as follows: on one hand, the antistatic ring 124 is placed between the first buffer layer 121 and the first insulation layer 122, and an area corresponding to the first buffer layer 121 and the first insulation layer 122 is equal to an area where the peripheral structure is located as described above, so that the antistatic ring 124 is not located at a position of the incoming end of the test wiring, which prevents a technical problem of damage to the test wiring by static electricity on the antistatic ring 124, is not located between the test wiring and the peripheral structure, which does not need to make the width of the antistatic ring 124 small, and is not located at the side of the peripheral structure away from the display area either, which will not widen the border of the organic light-emitting display panel and will not make damage to the antistatic ring 124 when cutting. That is to say, an arrangement of the antistatic ring 124 won't cause the problems caused in the first, second, and fourth solutions. On the other hand, since the antistatic ring 124 is made of the gate metallic layer, which is located above the first buffer layer 121 and below the first insulation layer 122 and the second insulation layer 123, even though that position is an area for preventing extending of a cutting crack, the crack on that position won't cause crack on the gate metallic layer, and thus the antistatic ring 124 will not crack. Thus, a resistance of the antistatic ring 124 may not increase, the electrostatic shielding effect of the antistatic ring 124 won't be adversely affected, and a function of the area for preventing crack extending won't be weakened. That is to say, the arrangement of the antistatic ring 124 won't cause the problems caused in the third solution.

In addition, the organic light-emitting display panels as shown in FIGS. 1, 4, 6, 7, and 9 are rectangular, while the organic light-emitting display panels as shown in FIG. 11 of the present embodiment, based on a rectangular shape, further includes a rectangular protrusion 13 where the integrated circuit IC is located, so that compared with the organic light-emitting display panels described as above, the part of the present organic light-emitting display panel where the integrated circuit IC is located can be easily bended to a back side of the organic light-emitting display panel, thereby reducing the width of a bottom border of the organic light-emitting display panel.

Further, the first buffer layer 121, the second buffer layer 111, the first insulation layer 122, the second insulation layer 123, the third insulation layer 115, the fourth insulation layer 117, and the gate insulation layer 113 can be all inorganic layers. For example, materials of the inorganic layers may include silicon oxide or silicon nitride. Silicon oxide and silicon nitride can effectively block oxygen, water moisture, and impurities and prevent them from affecting performance of the organic light-emitting member 2. The first and second buffer layers 121, 111 made of materials including silicon oxide or silicon nitride can make an upper surface of the flexible substrate 10 flatter, which is good for forming of other followed layers. The planarization layer 119 can be an organic layer. A material of the flexible substrate 10 can be polyimide (PI) with a good resistance to high temperature. The flexible substrate 10 may include a single layer of PI film, or include a plurality of layers of PI film adhered one another, which is not limited in the present embodiment of the present disclosure.

In one embodiment, as shown in FIG. 13, the polysilicon layer 112 includes an active layer; the gate metallic layer 114 includes a gate line (not shown in FIG. 13), a gate electrode, and a first electrode plate; the capacitor metallic layer 116 includes a second electrode plate; and the source-drain metallic layer 118 includes a data line (not shown in FIG. 13), a source electrode, and a drain electrode. The first electrode plate and the second electrode plate form a storage capacitor Cst. The source electrode is electrically connected with the active layer by a first via hole defined through the fourth insulation layer 117, the third insulation layer 115, and the gate insulation layer 113. The drain electrode is electrically connected with the active layer by a second via hole defined through the fourth insulation layer 117, the third insulation layer 115, and the gate insulation layer 113. The gate line is electrically connected with the gate electrode. The data line is electrically connected with the source electrode. The drain electrode is electrically connected with one electrode layer of the organic light-emitting member 2. The gate electrode, the active layer, the source electrode, and the drain electrode form a drive transistor of the organic light-emitting member 2. A current of the organic light-emitting member 2 is controlled by controlling an on-state of the drive transistor, and then a luminous brightness of the organic light-emitting member 2 is controlled. The storage capacitor Cst is used for keeping the on-state of the drive transistor.

In one embodiment, the organic light-emitting member 2 is an organic light-emitting diode, and, correspondingly, as shown in FIG. 13, the organic light-emitting member 2 includes a reflection anode layer 21, a light-emitting layer 22, and a cathode layer 23. The reflection anode layer 21, the light-emitting layer 22, and the cathode layer 23 are sequentially placed on the planarization layer 119 of the array substrate 1 along a direction from the the array substrate 1 to the encapsulation layer 3. The reflection anode layer 21 is electrically connected with the drain electrode of the drive transistor. The organic light-emitting member 2 is a top-typed organic light-emitting diode. Since light emitted from the top-typed organic light-emitting diode will not be shielded by structures on the array substrate, the organic light-emitting display panel including the organic light-emitting member 2 has a high aperture ratio. For example, the anode layer 21 can be ITO(150 Å)/Ag (1000 Å)/ITO(150 Å), and the cathode layer 23 can be Mg/Ag alloy with a thickness of 150 Å. In one embodiment, the organic light-emitting member 2 may further include a capping layer (CPL), for improving a transmissivity of the organic light-emitting member 2. It should be noted that, a material and thickness of the reflection anode layer 21 and the cathode layer 23 are not limited in the embodiments of the present disclosure.

It should be understood that, the organic light-emitting member 2 can be a bottom-typed organic light-emitting diode. When the organic light-emitting member 2 is a bottom-typed organic light-emitting diode, the cathode layer 23 of the organic light-emitting member 2 reflects light. The anode layer 21 is translucent, and light can exit through the anode layer 21. For example, the anode layer 21 can be ITO(150 Å), and the cathode layer 23 can be Mg/Ag alloy with a thickness of 1000 Å.

The antistatic ring 124, the first buffer layer 121, the first insulation layer 122, and the second insulation layer 123 placed in the non-display area 12 will be described hereinafter.

In one embodiment, as shown in FIG. 11, the non-display area 12 includes a first side area 12a, a second side area 12b, a third side area 12c, and a fourth side area 12d. The first side area 12a, the second side area 12b, the third side area 12c, and the fourth side area 12d are sequentially connected together end to end. The integrated circuit IC is placed in the first side area 12a, and two ends of the antistatic ring 124 are placed in the first side area 12a, so that the integrated circuit IC can be easily electrically connected with the antistatic ring 124.

In one embodiment, as shown in FIG. 11, the antistatic ring 124 includes, in the first side area 12a, a first extending portion 124a and a second extending portion 124b. The first extending portion 124a and the second extending portion 124b are both integral structures, and extend along a first direction x. Widths of the first and second extending portions 124a, 124b are relatively great, which is good for conducting away the static electricity. The first direction x is a cutting direction of a part of the organic light-emitting display panel where the first or second extending portion is located, that is to say, for the first extending portion 124a, the first direction x is the cutting direction of a part of the organic light-emitting display panel where the first extending portion 124a is located; and for the second extending portion 124b, the first direction x is the cutting direction of a part of the organic light-emitting display panel where the second extending portion 124b is located. The cutting direction refers to, in a process of making the organic light-emitting display panel, a cutting direction along which a plurality of organic light-emitting display panels is cut into separate organic light-emitting display panels. Thus, the cutting direction of a specific area of the organic light-emitting display panel is an extending direction of an outer edge of the specific area.

Figure 14:
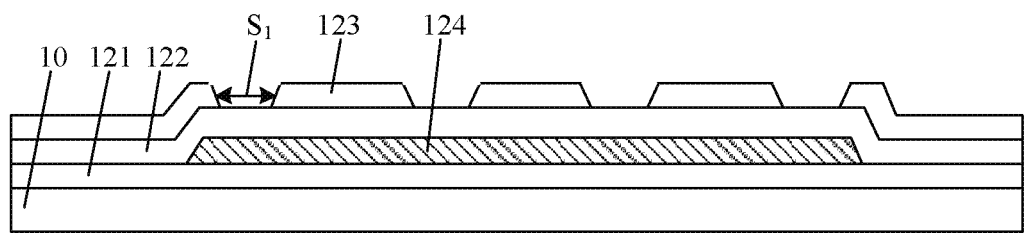
FIG. 14 is a first cross-sectional schematic view along direction B-B' in FIG. 11 according to an embodiment of the present disclosure.

In one embodiment, referring to FIG. 14, which is a first cross-sectional schematic view along direction B-B' in FIG. 11, a plurality of first grooves $S_1$ is defined in a portion of the second insulation layer 123 corresponding to the first and second extending portions 124a, 124b. An extending direction of the first grooves $S_1$ is parallel to the first direction x. A depth of the first groove $S_1$ is smaller than or equal to a thickness of the second insulation layer 123. The first grooves $S_1$ can effectively prevent a crack from extending in the second insulation layer 123 in the first side area 12a, which is good for keeping stability of the organic light-emitting display panel. In such situation, the first insulation layer 122 and the first buffer layer 121 can be both integral-layer structures.

Figure 15:
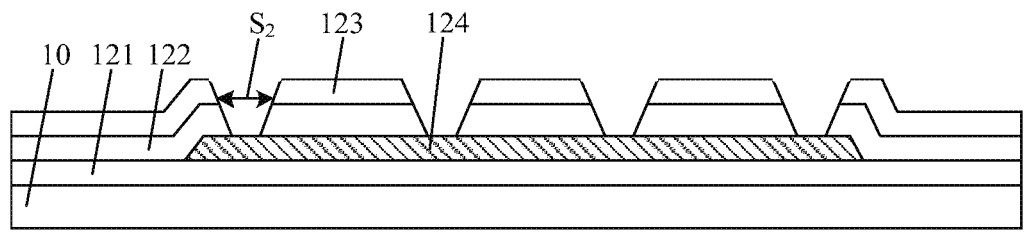
FIG. 15 is a second cross-sectional schematic view along direction B-B' in FIG. 11 according to an embodiment of the present disclosure.

In one embodiment, as shown in FIG. 15, which is a second cross-sectional schematic view along direction B-B' in FIG. 11, a plurality of second grooves $S_2$ is defined in a portion of the second insulation layer 123 and a portion of the first insulation layer 122, corresponding to the first and second extending portions 124a, 124b. An extending direction of the second grooves $S_2$ is parallel to the first direction x. A depth of the second groove $S_2$ is greater than the thickness of the second insulation layer 123, and is smaller than or equal to a sum of a thickness of the first insulation layer 122 and the thickness of the second insulation layer 123. The second grooves $S_2$ can effectively prevent a crack from extending in the first insulation layer 122 and the second insulation layer 123 in the first side area 12a, which is good for keeping stability of the organic light-emitting display panel. In such situation, the first buffer layer 121 can be an integral-layer structure.

It should be noted that, the first grooves $S_1$ can effectively prevent a crack from extending in the second insulation layer 123 in the first side area 12a, and the second grooves S2 can effectively prevent a crack from extending in the first insulation layer 122 and the second insulation layer 123 in the first side area 12a, so that the first grooves $S_1$ and the second grooves $S_2$ in the non-display area 12 can be selected according to a process difficulty and a cost, on a premise of meeting a request for prevent the crack from extending in the first side area 12a.

Further, when the portion of the first buffer layer 121 corresponding to the first and second extending portions 124a, 124b, the portion of the first insulation layer 122 corresponding to the first and second extending portions 124a, 124b, and the portion of the second insulation layer 123 corresponding to the first and second extending portions 124a, 124b have the above-mentioned structures, in one embodiment, portions of the first buffer layer 121, the first insulation layer 122, and the second insulation 123, which respectively correspond to another two portions of the antistatic ring 124 in the first side area 12a which do not extend along the first direction x, have the same structures as the structures of the portions of the first buffer layer 121, the first insulation layer 122, and the second insulation 123, which respectively correspond to the portions of the antistatic ring 124 in the second side area 12b, the third side area 12c, and the fourth side area 12d. In one embodiment, take the second side area 12b for example, as shown in FIG. 12, in the second side area 12b, the portions of the first buffer layer 121, the first insulation layer 122, and the second insulation layer 123, which respectively correspond the portion of the antistatic ring 124 in the second side area 12b are all integral-layer structures, and a plurality of slits S is defined in the second insulation layer 123, or in the first insulation layer 122 and the second insulation layer 123, or in the first buffer layer 121, the first insulation layer 122 and the second insulation layer 123, at a side of the antistatic ring 124 away from the display area 11. The plurality of slits S can effectively prevent crack extending, which is good for keeping stability of the organic light-emitting display panel.

In one embodiment, as shown in FIGS. 16-19, which are top views of four kinds of organic light-emitting display panel according to the embodiments of the present disclosure, each of the two portions of the antistatic ring 124 extending along the first direction x in the first side area 12a includes a plurality of strip-shaped structures 1241, and an extending direction of the strip-shaped structures 1241 is parallel to the first direction x. Thus, the first buffer layer 121, the first insulation layer 122, and the second insulation layer 123 in the first side area 12a of the non-display area 12 can be designed more flexibly.

Figure 16:
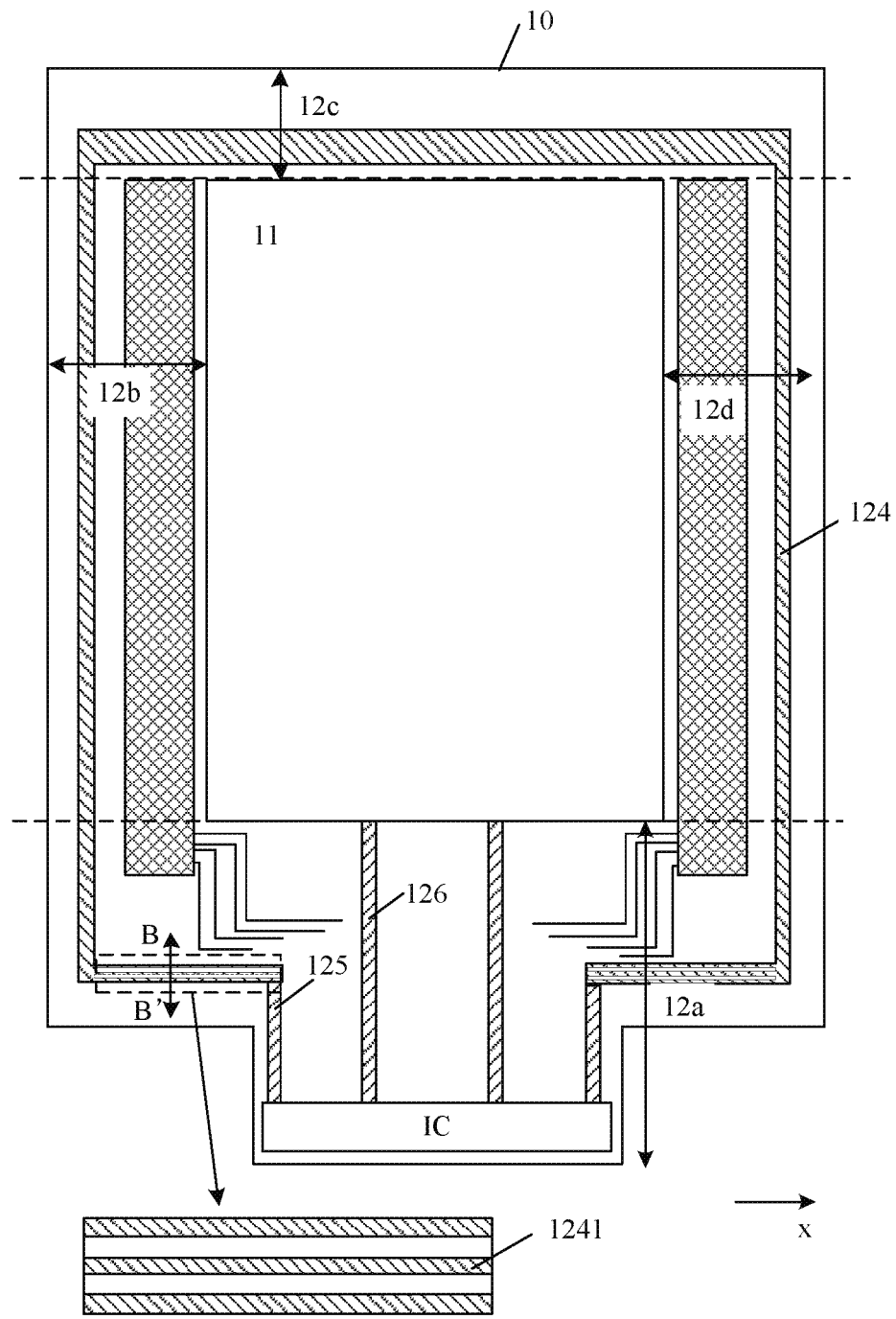
FIG. 16 is a top view of another organic light-emitting display panel according to an embodiment of the present disclosure.

In one embodiment, as shown in FIG. 16, each of the two portions of the antistatic ring 124 extending along the first direction x in the first side area 12a is separated into a plurality of strip-shaped structures 1241 extending from a head end to a tail end of the respective portion. A length of each strip-shaped structure 1241 is equal to a length of the respective portion of the antistatic ring 124 extending along the first direction x in the first side area 12a. The head end refers to a left side in an orientation in FIG. 14, and the tail end refers to a right side in the orientation in FIG. 14.

Figure 17:
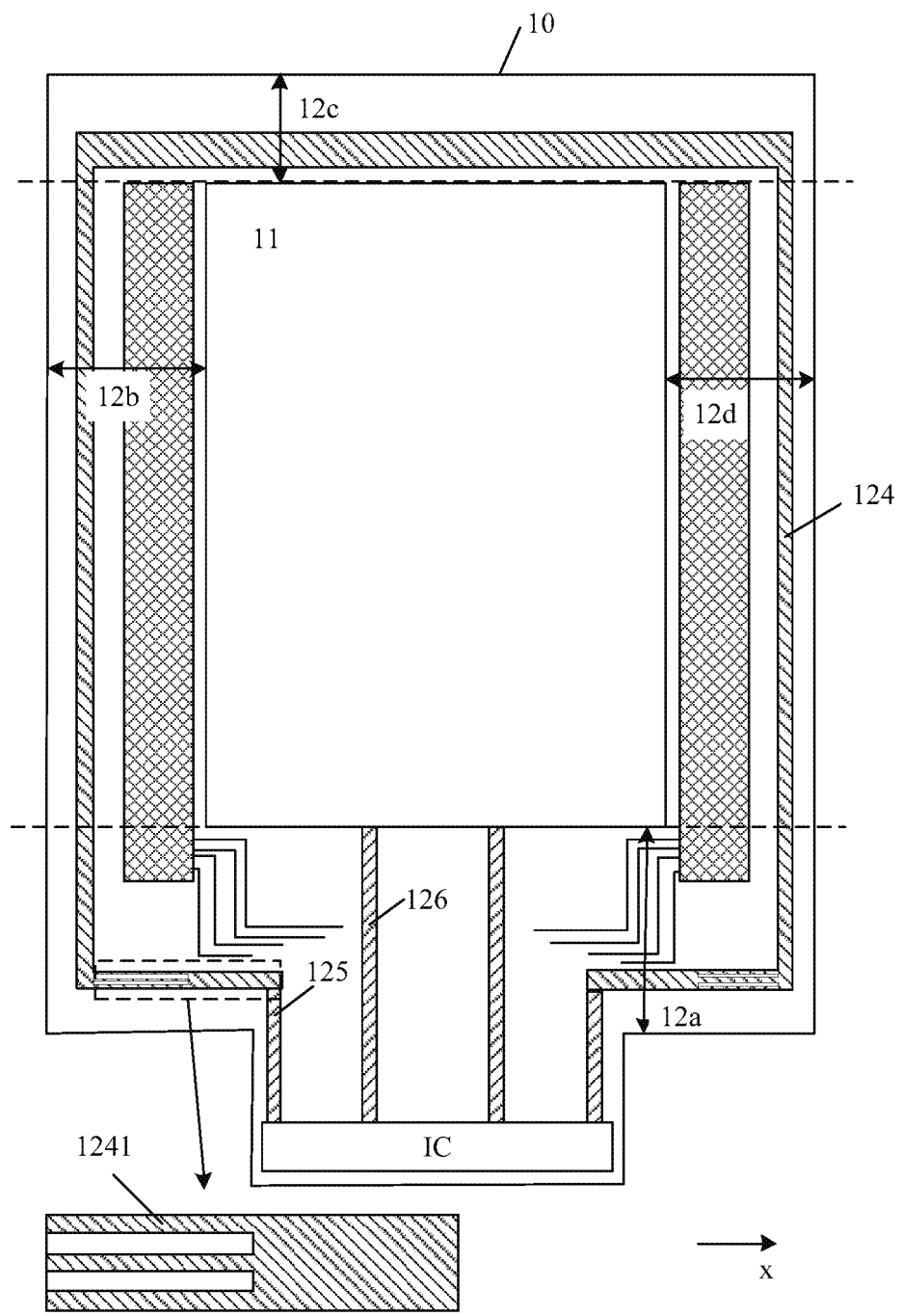
FIG. 17 is a top view of still another organic light-emitting display panel according to an embodiment of the present disclosure.

In one embodiment, as shown in FIG. 17, each of the two portions of the antistatic ring 124 extending along the first direction x in the first side area 12a is separated into a plurality of strip-shaped structures 1241 extending from a head end to a middle position of the respective portion. A length of each strip-shaped structure 1241 is smaller than a length of the respective portion of the antistatic ring 124 extending along the first direction x in the first side area 12a. The head end refers to a left side in an orientation in FIG. 15.

Figure 18:
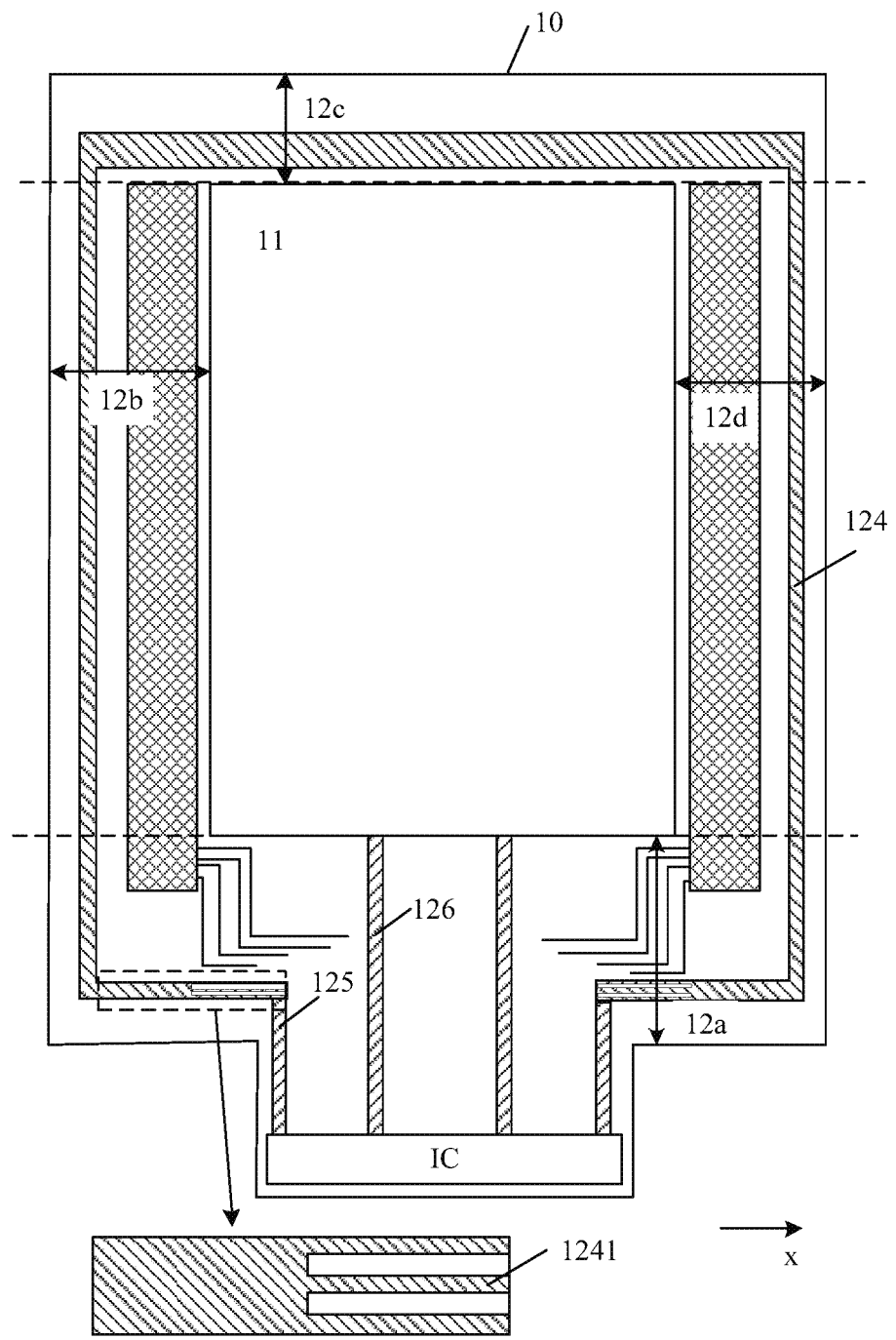
FIG. 18 is a top view of still another organic light-emitting display panel according to an embodiment of the present disclosure.

In one embodiment, as shown in FIG. 18, each of the two portions of the antistatic ring 124 extending along the first direction x in the first side area 12*a* is separated into a plurality of strip-shaped structures 1241 extending from a middle position to a tail end of the respective portion. each strip-shaped structure 1241 is A length of each strip-shaped structure 1241 is smaller than a length of the respective portion of the antistatic ring 124 extending along the first direction x in the first side area 12*a* and parallel to the first direction x. The tail end refers to a right side in an orientation in FIG. 16.

Figure 19:
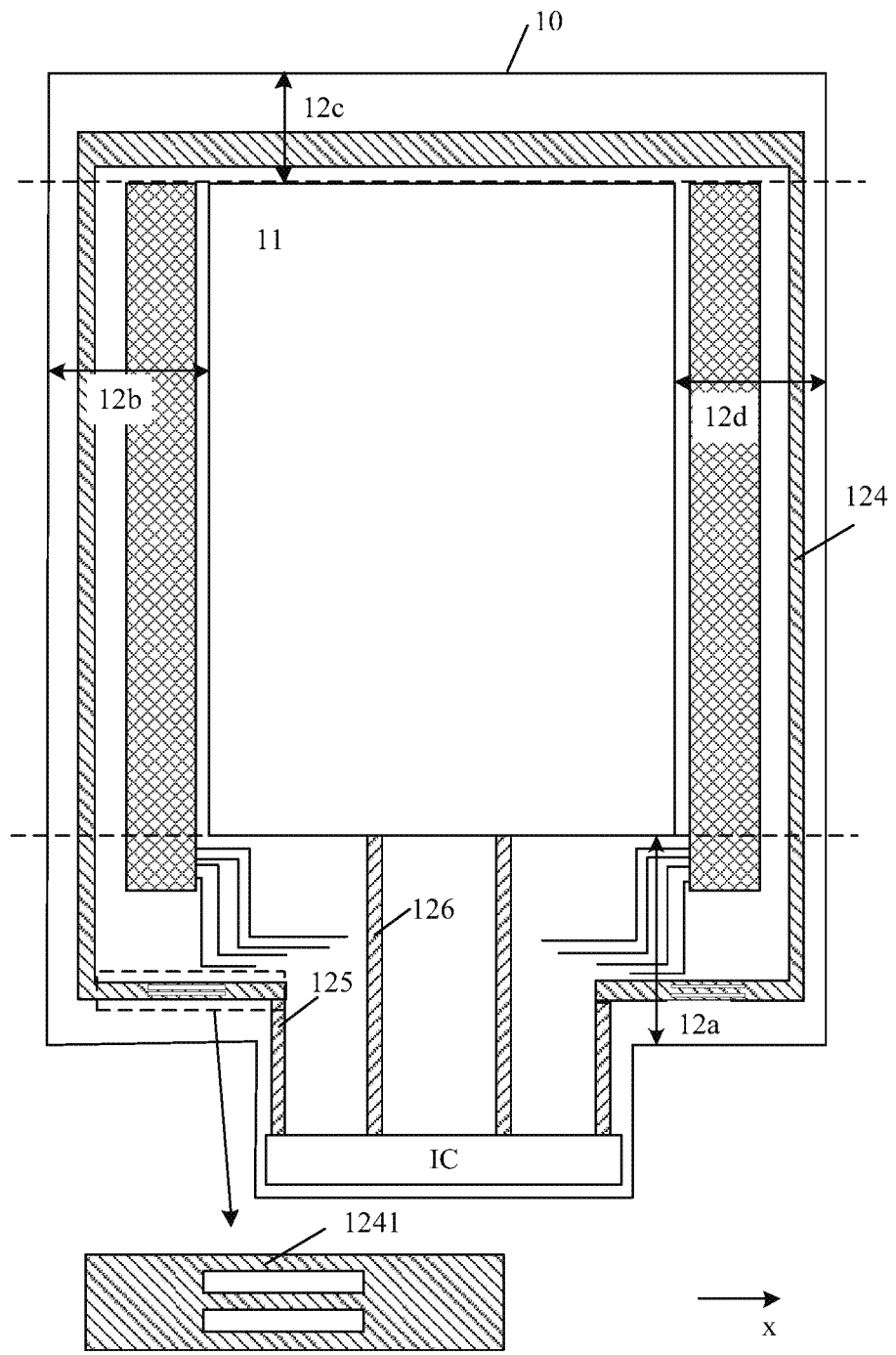
FIG. 19 is a top view of still another organic light-emitting display panel according to an embodiment of the present disclosure.

In one embodiment, as shown in FIG. 19, a middle portion of each of the two portions of the antistatic ring 124 extending along the first direction x in the first side area 12*a* is separated into a plurality of strip-shaped structures 1241. A length of each strip-shaped structure 1241 is smaller than a length of a length of the respective portion of the antistatic ring 124 extending along the first direction x in the first side area 12*a*.

It should be noted that, the greater the length of the strip-shaped structures 1241, the greater a resistance of the respective portion of the antistatic ring 124 extending along the first direction x in the first side area 12*a*, which is bad for conducting away static electricity, while is good for defining grooves with a greater depth in a larger area, thereby improving effect of preventing crack extending. The length of the strip-shaped structures 1241 can be selected according to actual requirements. In addition, for the strip-shaped structures 1241 with a same length, a position of the strip-shaped structures 1241 can be from the head end to the middle portion, or in the middle portion, or from the middle position to the tail end of the respective two portions of the antistatic ring 124 extending along the first direction x in the first side area 12*a*, which can be selected according to requirements for a crack extending position during use of the organic light-emitting display panel.

In one embodiment, as shown in FIGS. 16-19, each of the two portions of the antistatic ring 124 extending along the first direction x in the first side area 12*a* includes three strip-shaped structures 1241. It should be understood that, the number of the strip-shaped structures 1241 is not limited to be three, which is not limited in the embodiments of the present disclosure.

The above are merely examples of a situation that the two portions of the antistatic ring 124 extending along the first direction x in the first side area 12*a* have the same structure, however, the two portions can also have different structures, and each of the two portions can independently adopt any one of the structures described as above, which is not limited in the embodiments of the present disclosure. For example, structures of the two portions of the antistatic ring 124 extending along the first direction x in the first side area 12*a* can be selected based on a comprehensive consideration of the resistance of the two portions, electrostatic discharging protection effect, the crack extending position during use of the organic light-emitting display panel, and the effect of preventing crack extending.

Take the antistatic ring 124 with the structure as shown in FIG. 16 for example, the structures of the first buffer layer 121, the first insulation layer 122, and the second insulation layer 123 are illustrated as follows.

Figure 20:
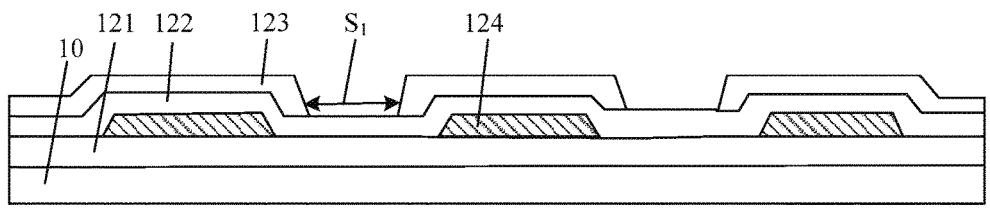
FIG. 20 is a first cross-sectional schematic view taken along direction B-B' in FIG. 16 according to an embodiment of the present disclosure.

In one embodiment, as shown in FIG. 20, which is a cross-sectional schematic view along direction B-B' in FIG. 16, a plurality of first grooves $S_1$ is defined in a portion of the second insulation layer 123 corresponding to the two portions of the antistatic ring 124 extending along the first direction x in the first side area 12*a*. An extending direction of the first grooves $S_1$ is parallel to the first direction x, and a depth of the first groove $S_1$ is smaller than or equal to a thickness of the second insulation layer 123. The first grooves $S_1$ can effectively prevent crack from extending in the second insulation layer 123 in the first side area 12*a*, which is good for keeping stability of the organic light-emitting display panel. In such situation, each of the first insulation layer 122 and the first buffer layer 121 is an integral-layer structure.

Figure 21:
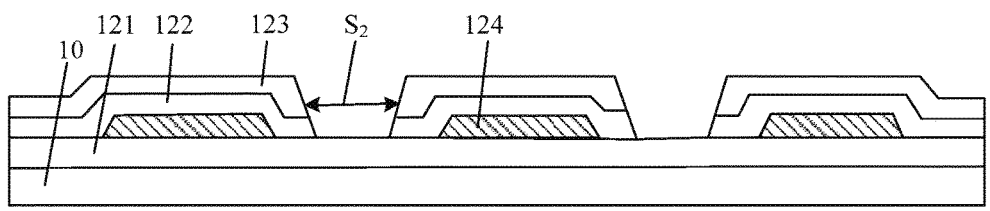
FIG. 21 is a second cross-sectional schematic view along direction B-B' in FIG. 16 according to an embodiment of the present disclosure.

In one embodiment, as shown in FIG. 21, which is another cross-sectional schematic view along direction B-B' in FIG. 16, a plurality of second grooves $S_2$ is defined in a portion of the second insulation layer 123 and a portion of the first insulation layer 122, corresponding to the two portions of the antistatic ring 124 extending along the first direction x in the first side area 12*a*. An extending direction of the second grooves $S_2$ is parallel to the first direction x. A depth of the second groove $S_2$ is greater than the thickness of the second insulation layer 123, and is smaller than or equal to a sum of a thickness of the first insulation layer 122 and the thickness of the second insulation layer 123. The second grooves $S_2$ can effectively prevent a crack from extending in the first insulation layer 122 and the second insulation layer 123 in the first side area 12*a*, which is good for keeping stability of the organic light-emitting display panel. In such situation, the first buffer layer 121 is an integral-layer structure.

Figure 22:
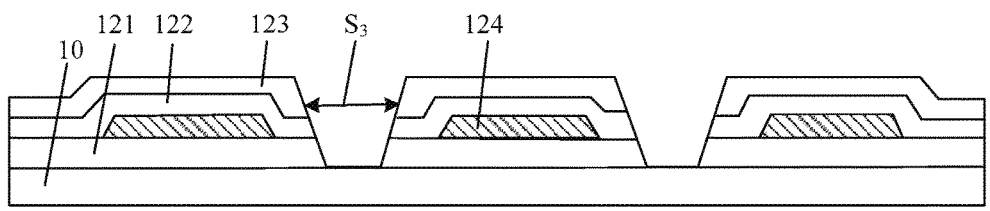
FIG. 22 is a third cross-sectional schematic view along direction B-B' in FIG. 16 according to an embodiment of the present disclosure.

In one embodiment, as shown in FIG. 22, which is another cross-sectional schematic view along direction B-B' in FIG. 16, a plurality of third grooves $S_2$ is defined in a portion of the second insulation layer 123, a portion of the first insulation layer 122, and a portion of the first buffer layer 121, corresponding to the two portions of the antistatic ring 124 extending along the first direction x in the first side area 12*a*. An extending direction of the third grooves $S_3$ is parallel to the first direction x. A depth of the third groove $S_3$ is greater than a sum of the thickness of the first insulation layer 122 and the thickness of the second insulation layer 123, but is smaller than or equal to a sum of the thickness of the first buffer layer 121, the thickness of the first insulation layer 122, and the thickness of the second insulation layer 123. Orthographic projections of the third grooves $S_3$ on the array substrate 1 do not overlap orthographic projections of the strip-shaped structures 1241 on the array substrate 1. The third grooves $S_3$ can effectively prevent a crack from extending in the second insulation layer 123, the first insulation layer 122, and the first buffer layer 121 in the first side area 12*a*, which is good for keeping stability of the organic light-emitting display panel.

It should be noted that, the third grooves $S_3$ can effectively prevent a crack from extending in the second insulation layer 123, the first insulation layer 122, and the first buffer layer 121 in the first side area 12*a*, the second grooves $S_2$ can effectively prevent a crack from extending in the first insulation layer 122 and the second insulation layer 123 in the first side area 12*a*, and the first grooves $S_1$ can effectively prevent a crack from extending in the second insulation layer 123 in the first side area 12*a*, so that the first grooves $S_1$, the second grooves $S_2$, and the third grooves $S_3$ in the non-display area 12 can be selected according to a comprehensive consideration about effect of preventing crack extending, the process difficulty and the cost, that is, to select grooves with low process difficulty and low cost while meeting a request for preventing crack extending.

Additionally, when the portion of the first buffer layer 121 corresponding to corresponding to the two portions of the antistatic ring 124 extending along the first direction x in the first side area 12a, the portion of the first insulation layer 122 corresponding to the two portions of the antistatic ring 124 extending along the first direction x in the first side area 12a, and the portion of the second insulation layer 123 corresponding to the two portions of the antistatic ring 124 extending along the first direction x in the first side area 12a have the above-mentioned first structure or second structure, in one embodiment, portions of the first buffer layer 121, the first insulation layer 122, and the second insulation 123, which respectively correspond to another two portions of the antistatic ring 124 in the first side area 12a which do not extend along the first direction x, have the same structures as the structures of the portions of the first buffer layer 121, the first insulation layer 122, and the second insulation 123, which respectively correspond to the portions of the antistatic ring 124 in the second side area 12b, the third side area 12c, and the fourth side area 12d. In one embodiment, take the second side area 12b for example, as shown in FIG. 12, in the second side area 12b, portions of the first buffer layer 121, the first insulation layer 122, and the second insulation layer 123, which respectively correspond to the portion of the antistatic ring 124 in the second side area 12b are all integral-layer structures. A plurality of slits S is defined in the second insulation layer 123, or in the first insulation layer 122 and the second insulation layer 123, or in the first buffer layer 121, the first insulation layer 122 and the second insulation layer 123, at a side of the antistatic ring 124 away from the display area 11. The plurality of slits S can effectively prevent a crack from extending, which is good for keeping stability of the organic light-emitting display panel.

In addition, in one embodiment, one end of the antistatic ring 124 is electrically connected with a first signal end of the integrated circuit IC, and the other end of the antistatic ring 124 is electrically connected with a second signal end of the integrated circuit IC. An output signal of each of the first and second signal ends is a cathode signal (PVEE) or a ground signal (GND). With such arrangement, while static electricity accumulated on the antistatic ring 124 can be conducted away, a structure of the integrated circuit IC is simple.

In one embodiment, as shown in FIG. 11, one end of the antistatic ring 124 is electrically connected with the first signal end of the integrated circuit IC by a connection wiring 125 in the first side area 12a, and the other end of the antistatic ring 124 is electrically connected with the second signal end of the integrated circuit IC by the connection wiring 125 in the first side area 12a. The cathode layer (not shown in FIG. 11) of the organic light-emitting member is electrically connected with third and fourth signal ends of the integrated circuit IC by a cathode wiring 126 in the first side area 12a. Output signals of both of the third and fourth signal ends are cathode signals. The cathode wiring 126, the connection wiring 125, and the source-drain metallic layer 118 can be made in a same layer, for decreasing the cost and difficulty of the making process of the organic light-emitting display panel. For example, as shown in FIG. 11, two cathode wirings 126 are located on inner side of two connection wirings 125, so that a layout of the cathode wirings 126 and the connection wirings 125 is simple.

Apparently, other structures can be placed in the non-display area 12 of the embodiments of the present disclosure, such as a gate drive circuit and a test wiring.

In one embodiment, as shown in FIGS. 11 and 12, one each of the second side area 12b and the fourth side area 12d is provided with one gate drive circuit 127, and the gate drive circuits 127 are located at a side of an area occupied by the first buffer layer 121, the first insulation layer 122, and the second insulation layer 123 in the respective side areas 12b, 12d close to the display area 11. For example, one of the gate drive circuits 127 applies signals to all gate lines from one side of the display area 11, and the other one of the gate drive circuits 127 applies signals to all gate lines from anther side of the display area 11, which can shorten a drive time of the organic light-emitting display panel; or, one of the gate drive circuits 127 applies signals to all gate lines at odd positions, and the other one of the gate drive circuits 127 applies signals to all gate lines at even positions, which can simplify a structure of each gate drive circuit 127.

Furthermore, a distance between the antistatic ring 124 and the gate drive circuit 127 is greater than or equal to 100 μm, for preventing static electricity accumulated on the antistatic ring 124 from making damage to the gate drive circuit 127, thereby facilitating maintaining the functionality of the display of the organic light-emitting display panel.

In one embodiment, as shown in FIG. 11, two groups of test wirings are further placed in the first side area 12a, and are used for testing the organic light-emitting display panel before delivery. Each group of test wirings is electrically connected with one gate drive circuit 127. The test wirings are located at a side of the antistatic ring 123 close to the display area 11.

A structure of the encapsulation layer 3 in the embodiments of the present disclosure is illustrated as follows. The encapsulation layer 3 is used for blocking moisture and oxygen, thereby preventing failure of the organic light-emitting member 2 caused by corrosion by moisture and oxygen. The organic light-emitting display panel in the embodiments of the present disclosure can be packaged by a thin film encapsulation (TFE) method, so that both the flexible substrate and the organic light-emitting member can be packaged simultaneously. Correspondingly, the encapsulation layer 3 may include a plurality of thin films, such as three-layer or five-layer structure including inorganic layer+organic layer+inorganic layer. The inorganic layer is used for blocking moisture and oxygen, and the organic layer is used for alleviating a bending stress. A material of the inorganic layer can be silicon nitride or silicon oxide, a thickness of the inorganic layer can be about 1 μm, and the inorganic layer can be made by deposition, such as Plasma Enhanced Chemical Vapor Deposition (PECVD), Atomic layer deposition (ALD). A material of the organic layer can be organosilicon compound, aromatic compound, benzene with two substituent groups, styrene, a thickness of the organic layer can be about 10 μm, and the organic layer can be made by an ink-jet printing method. It should be noted that, the thickness and the material of the organic layer are not limited in the embodiments of the present disclosure.

In addition, as shown in FIG. 12, two banks 129 can be placed in the non-display area 12, the bank 129 close to the display area 11 is used as an end of the organic layer, and the bank 129 away from the display area 11 is used for preventing a cutting crack generated in the cutting process of the organic light-emitting display panel from extending in the inorganic layers. The bank 129 may contain a variety of materials, for example, different film layers in the organic light-emitting display panel are stacked to form the bank 129.

For example, as shown in FIG. 13, when a pixel defining layer 4 and a support post 5 are placed in the display area 11, as shown in FIG. 12, the bank 129 close to the display area 11 can include a portion made together with the pixel defining layer 4 in a same process and a portion made together with the support post 5 in a same process, and the bank 129 away from the display area 11 can include a portion made together with the planarization layer in a same process, a portion made together with the pixel defining layer in a same process, and a portion made together with the support post 5 in a same process, so that a making difficulty and cost of the organic light-emitting display panel can be decreased.

Figure 23:
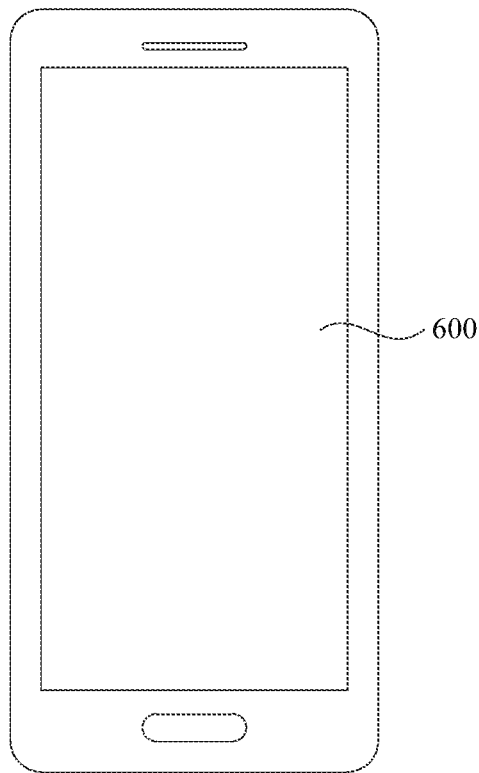
FIG. 23 is a top view of an organic light-emitting display device according to an embodiment of the present disclosure.

As shown in FIG. 23, which is a top view of an organic light-emitting display device according to an embodiment of the present disclosure, the organic light-emitting display device includes any one of the organic light-emitting display panels 600 as described above. The display device in the embodiment of the present disclosure can be any flexible product or component with a display function, such as smart mobile phone, wearable smart watch, smart glasses, tablet computer, TV, display, notebook computer, digital photo frame, navigator, car monitor, and electronic book, etc.

Figure 24:
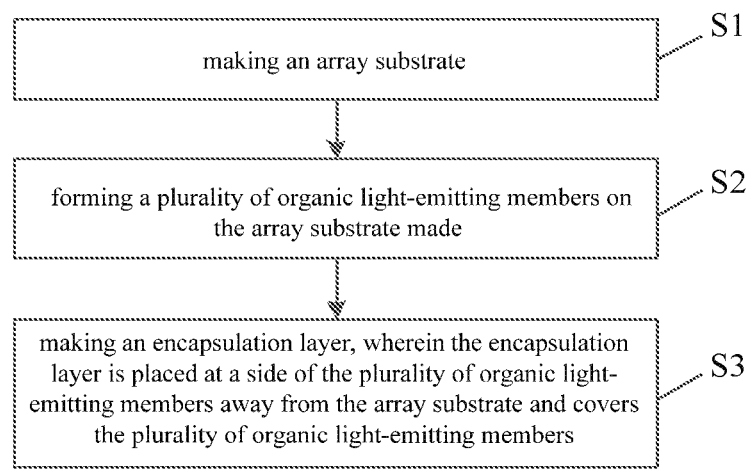
FIG. 24 is a flowchart of a method for making an organic light-emitting display panel according to an embodiment of the present disclosure.

The present disclosure provides a method for making an organic light-emitting display panel. As shown in FIG. 24, which is a flowchart of a method for making an organic light-emitting display panel according to an embodiment of the present disclosure. In the method, an array substrate is made, a plurality of organic light-emitting members is formed on the array substrate made, and then an encapsulation layer is made and the encapsulation layer is placed on a side of the plurality of organic light-emitting members away from the array substrate and covers the plurality of organic light-emitting members.

In one embodiment, the array substrate may be made according to the following manner: a flexible substrate including a display area and a non-display area surrounding the display area is provided; a first buffer layer, an antistatic ring, a first insulation layer, and a second insulation layer are sequentially formed in the non-display area of the flexible substrate, an extending direction of the antistatic ring is a circumferential direction of the non-display area, and the antistatic ring is non-closed in its extending direction; and a second buffer layer, a polysilicon layer, a gate insulation layer, a gate metallic layer, a third insulation layer, a capacitor metallic layer, a fourth insulation layer, a source-drain metallic layer, and a planarization layer are sequentially formed in the display area of the flexible substrate. The second buffer layer and the first buffer layer are made in a same process, the third insulation layer and the first insulation layer are made in a same process, the fourth insulation layer and the second insulation layer are made in a same process, and the antistatic ring and the gate metallic layer are made in a same process.

Figure 25:
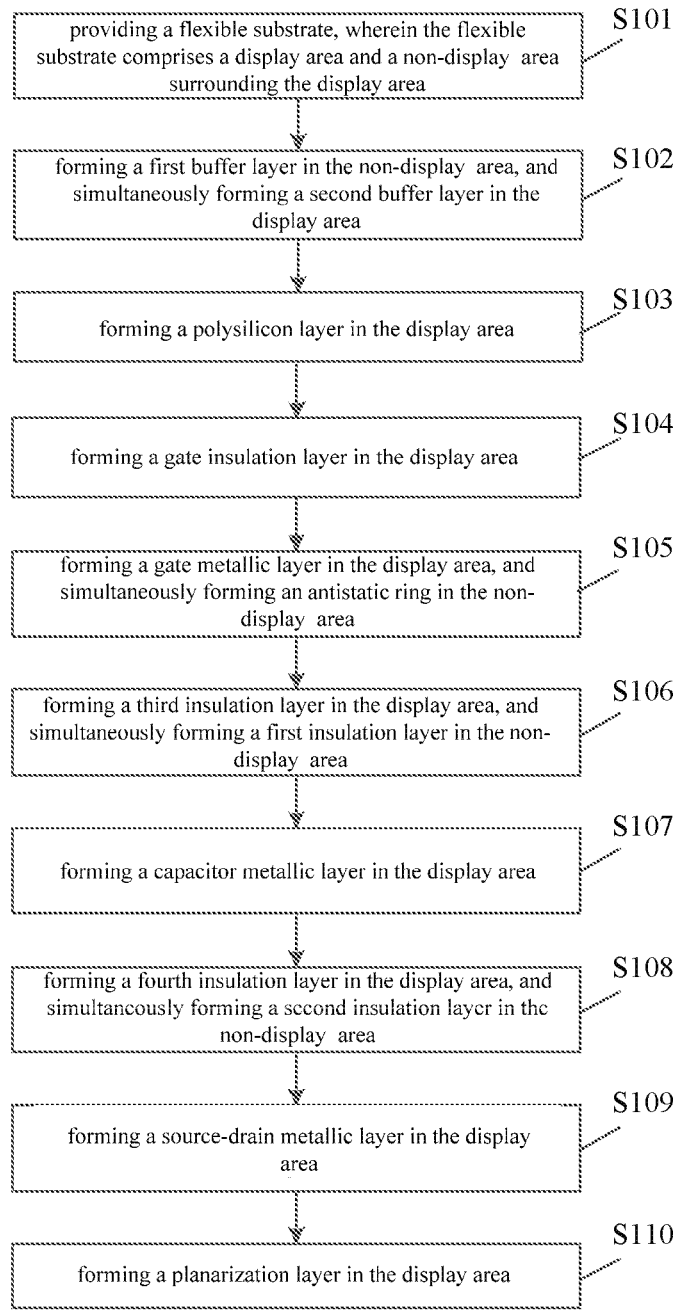
FIG. 25 is a flowchart of a method for making an array substrate according to an embodiment of the present disclosure.

In one embodiment, as shown in FIG. 25, which is a flowchart of a method for making the array substrate according to an embodiment of the present disclosure. In the method, a flexible substrate including a display area and a non-display area surrounding the display area is provided; a first buffer layer is formed in the non-display area while a second buffer layer is simultaneously formed in the display area; a polysilicon layer is formed in the display area; a gate insulation layer is formed in the display area; a gate metallic layer is formed in the display area while an antistatic ring is simultaneously formed in the non-display area; a third insulation layer is formed in the display area while a first insulation layer is simultaneously formed in the non-display area; a capacitor metallic layer is formed in the display area; a fourth insulation layer is formed in the display area while a second insulation layer is simultaneously formed in the non-display area; a source-drain metallic layer is formed in the display area; and a planarization layer is formed in the display area.

In one embodiment, as shown in FIG. 11, the non-display area 12 sequentially includes a first side area 12a, a second side area 12b, a third side area 12c, and a fourth side area 12d, and the first side area 12a, the second side area 12b, the third side area 12c, and the fourth side area 12d are connected together end to end. An integrated circuit IC is placed in the first side area 12a. The antistatic ring 124 comprises two portions (124a and 124b shown in FIG. 11) respectively extending along a first direction x in the first side area 12a, and both the two portions are integral structures.

For the antistatic ring 124 with the above-described structures, in the embodiments of the present disclosure, portions of the first buffer layer 121, the first insulation layer 122, and the second insulation layer 123, respectively corresponding to the two portions of the antistatic ring 124 extending along a first direction x in the first side area 12a can be structured as shown in FIGS. 12 and 13.

When making the structure as shown in FIG. 12, the method for making an organic light-emitting display panel further includes: defining a plurality of first grooves 51 in a portion of the second insulation layer 123 corresponding to the two portions of the antistatic ring 124 extending along a first direction x in the first side area 12a by an etching method. An extending direction of the first grooves $S_1$ is parallel to the first direction x. A depth of the first groove $S_1$ is smaller than or equal to a thickness of the second insulation layer 123.

When making the structure as shown in FIG. 13, the method for making an organic light-emitting display panel further includes: defining a plurality of second grooves $S_2$ in a portion of the second insulation layer 123 and a portion of the first insulation layer 122, respectively corresponding to the two portions of the antistatic ring 124 extending along a first direction x in the first side area 12a, by an etching method. An extending direction of the second grooves $S_2$ is parallel to the first direction x. A depth of the second groove $S_2$ is greater than the thickness of the second insulation layer 123, but is smaller than or equal to a sum of a thickness of the first insulation layer 122 and the thickness of the second insulation layer 123.

In one embodiment, as shown in FIGS. 14-17, the non-display area 12 sequentially includes a first side area 12a, a second side area 12b, a third side area 12c, and a fourth side area 12d, the first side area 12a, the second side area 12b, the third side area 12c, and the fourth side area 12d are connected together end to end. An integrated circuit IC is placed in the first side area 12a. As shown in FIGS. 14-17, each of the two portions of the antistatic ring 124 extending along a first direction x in the first side area 12a includes a plurality of strip-shaped structures 1241, and an extending direction of the strip-shaped structures 1241 is parallel to the first direction x.

For example, for the antistatic ring 124 with the structure as shown in FIG. 14, in the embodiments of the present disclosure, a portion of the first buffer layer 121, a portion of the first insulation layer 122, and a portion of the second insulation layer 123, which respectively correspond to two portions of the antistatic ring 124 extending along a first direction x in the first side area 12a can be structured as shown in FIGS. 18-20.

When making the structure as shown in FIG. 18, the method for making an organic light-emitting display panel further includes: defining a plurality of first grooves $S_1$ in a portion of the second insulation layer 123 corresponding to the two portions of the antistatic ring 124 extending along a first direction x in the first side area 12a by an etching method. An extending direction of the first grooves $S_1$ is parallel to the first direction x. A depth of the first groove $S_1$ is smaller than or equal to a thickness of the second insulation layer 123.

When making the structure as shown in FIG. 19, the method for making an organic light-emitting display panel further includes: defining a plurality of second grooves $S_2$ in a portion of the second insulation layer 123 and a portion of the first insulation layer 122, respectively corresponding to the two portions of the antistatic ring 124 extending along a first direction x in the first side area 12a, by an etching method. An extending direction of the second grooves $S_2$ is parallel to the first direction x. A depth of the second groove $S_2$ is greater than the thickness of the second insulation layer 123, but is smaller than or equal to a sum of a thickness of the first insulation layer 122 and the thickness of the second insulation layer 123.

When making the structure as shown in FIG. 20, the method for making an organic light-emitting display panel further includes: defining a plurality of third grooves $S_3$ in a portion of the second insulation layer 123, a portion of the first insulation layer 122, and a portion of the first buffer layer 121, respectively corresponding to the two portions of the antistatic ring 124 extending along a first direction x in the first side area 12a, by an etching method. An extending direction of the third grooves $S_3$ is parallel to the first direction x. A depth of the third groove $S_3$ is greater than the sum of a thickness of the first insulation layer 122 and the thickness of the second insulation layer 123, but is smaller than or equal to a sum of the thickness of the first insulation layer 122, the thickness of the second insulation layer 123, and a thickness of the first buffer layer 121. Orthographic projections of the third grooves $S_3$ on the array substrate 1 do not overlap orthographic projections of the strip-shaped structures 1241 on the array substrate 1.

In one embodiment, the step of defining the plurality of third grooves by the etching method can be: defining the plurality of third grooves by only one etching process; or, defining a plurality of first sub-grooves through the first insulation layer and the second insulation layer by one etching process, and then defining a plurality of second sub-grooves in the first buffer layer by another etching process, the plurality of second sub-grooves being communicated with the first sub-grooves, thereby forming the third grooves.

It should be noted that, the structures of the organic light emitting display panels as described above are applicable to the above described methods for making an organic light-emitting display panel, which are no longer repeated herein.

Finally, it should be noted that embodiments described above are merely used to illustrate technical solutions of the present disclosure, but not to limit the present disclosure. Although the present disclosure is described in detail with reference to the above-mentioned embodiments, it will be understood by one of ordinary skill in the art: various modifications can be made to the technical solutions described in above-mentioned embodiments, and part or all of the technical features can replaced by equivalent substitutions, without departing from the scope of the technical solutions of various embodiments of the present disclosure.

What is claimed is:

1. An organic light-emitting display panel, comprising:
    an array substrate;
    an organic light-emitting member placed on the array substrate; and
    an encapsulation layer placed on a side of the organic light-emitting member away from the array substrate and covering the organic light-emitting member;
    wherein the array substrate comprises a flexible substrate, and the flexible substrate comprises a display area and a non-display area surrounding the display area;
    the array substrate further comprises a first buffer layer, a first insulation layer, a second insulation layer, and an antistatic ring, wherein the first buffer layer, the first insulation layer, and the second insulation layer are sequentially placed in the non-display area along a direction away from flexible substrate, the antistatic ring is placed between the first buffer layer and the first insulation layer, an extending direction of the antistatic ring is a circumferential direction of the non-display area, and the antistatic ring is non-closed in the extending direction;
    the array substrate further comprises a second buffer layer, a polysilicon layer, a gate insulation layer, a gate metallic layer, a third insulation layer, a capacitor metallic layer, a fourth insulation layer, a source-drain metallic layer, and a planarization layer, wherein the second buffer layer, the polysilicon layer, the gate insulation layer, the gate metallic layer, the third insulation layer, the capacitor metallic layer, the fourth insulation layer, the source-drain metallic layer, and the planarization layer are sequentially placed in the display area of the flexible substrate along a direction toward the organic light-emitting member; and
    wherein the second buffer layer and the first buffer layer are made in a same process, the third insulation layer and the first insulation layer are made in a same process, the fourth insulation layer and the second insulation layer are made in a same process, and the antistatic ring and the gate metallic layer are made in a same process.

2. The organic light-emitting display panel according to claim 1, wherein the polysilicon layer comprises an active layer, the gate metallic layer comprises a gate line, a gate electrode, and a first electrode plate, the capacitor metallic layer comprises a second electrode plate, and the source-drain metallic layer comprises a data line, a source electrode, and a drain electrode; the first electrode plate and the second electrode plate form a storage capacitor; the source electrode is electrically connected with the active layer by a first via hole, the first via hole is defined through the fourth insulation layer, the third insulation layer, and the gate insulation layer; the drain electrode is electrically connected with the active layer by a second via hole, the second via hole is defined by penetrating through the fourth insulation layer, the third insulation layer, and the gate insulation layer.

3. The organic light-emitting display panel according to claim 1, wherein the organic light-emitting member comprises a reflection anode layer, a light-emitting layer, and a cathode layer; the reflection anode layer, the light-emitting layer, and the cathode layer are sequentially placed on the planarization layer along a direction from the array substrate to the encapsulation layer.

4. The organic light-emitting display panel according to claim 1, wherein the non-display area comprises a first side area, a second side area, a third side area, and a fourth side area; the first side area, the second side area, the third side area, and the fourth side area are connected together end to end, an integrated circuit is placed in the first side area, both ends of the antistatic ring are placed in the first side area.

5. The organic light-emitting display panel according to claim 4, wherein the antistatic ring comprises two portions extending along a first direction in the first side area, each of the two portions of the antistatic ring extending along a first direction in the first side area is an integral structure, wherein the first direction is a cutting direction of a part of the organic light-emitting display panel where the two portions are located.

6. The organic light-emitting display panel according to claim 5, wherein a plurality of first grooves is defined in a portion of the second insulation layer corresponding to the two portions of the antistatic ring extending along the first direction in the first side area, an extending direction of the plurality of first grooves is parallel to the first direction, and a depth of each of the first grooves is smaller than or equal to a thickness of the second insulation layer.

7. The organic light-emitting display panel according to claim 5, wherein a plurality of second grooves is defined in a portion of the second insulation layer and a portion of the first insulation layer, respectively corresponding to the two portions of the antistatic ring extending along the first direction in the first side area, an extending direction of the plurality of second grooves is parallel to the first direction, a depth of each of the second grooves is greater than a thickness of the second insulation layer, but is smaller than or equal to a sum of a thickness of the first insulation layer and the thickness of the second insulation layer.

8. The organic light-emitting display panel according to claim 4, wherein the antistatic ring comprises two portions extending along a first direction in the first side area, each of the two portions comprises a plurality of strip-shaped structures, an extending direction of the plurality of strip-shaped structures is parallel to the first direction, wherein the first direction is a cutting direction of a part of the organic light-emitting display panel where the two portions are located.

9. The organic light-emitting display panel according to claim 8, wherein a plurality of first grooves is defined in a portion of the second insulation layer corresponding to the two portions of the antistatic ring extending along the first direction in the first side area, an extending direction of the plurality of first grooves is parallel to the first direction, and a depth of each of the first grooves is smaller than or equal to a thickness of the second insulation layer.

10. The organic light-emitting display panel according to claim 8, wherein a plurality of second grooves is defined in a portion of the second insulation layer and a portion of the first insulation layer, respectively corresponding to the two portions of the antistatic ring extending along the first direction in the first side area, an extending direction of the plurality of second grooves is parallel to the first direction, a depth of each of the second grooves is greater than a thickness of the second insulation layer, but is smaller than or equal to a sum of a thickness of the first insulation layer and the thickness of the second insulation layer.

11. The organic light-emitting display panel according to claim 8, wherein a plurality of third grooves is defined in a portion of the second insulation layer, a portion of the first insulation layer, and a portion of the first buffer layer, respectively corresponding to the two portions of the antistatic ring extending along the first direction in the first side area, an extending direction of the plurality of third grooves is parallel to the first direction, a depth of each of the third grooves is greater than a sum of a thickness of the first insulation layer and a thickness of the second insulation layer, but is smaller than or equal to a sum of a thickness of the first buffer layer, the thickness of the first insulation layer, and the thickness of the second insulation layer; orthographic projections of the third grooves on the array substrate do not overlap orthographic projections of the strip-shaped structures on the array substrate.

12. The organic light-emitting display panel according to claim 8, wherein each of the two portions of the antistatic ring extending along the first direction in the first side area comprises three strip-shaped structures.

13. The organic light-emitting display panel according to claim 4, wherein the antistatic ring comprises a first end and a second end, wherein the first end of the antistatic ring is electrically connected with a first signal end of the integrated circuit, the second end of the antistatic ring is electrically connected with a second signal end of the integrated circuit, and an output signal of each of the first signal end and the second signal end is a cathode signal or a ground signal.

14. The organic light-emitting display panel according to claim 13, wherein the first end of the antistatic ring is electrically connected with the first signal end of the integrated circuit by a connection wiring in the first side area, the second end of the two ends of the antistatic ring is electrically connected with the second signal end of the integrated circuit by the connection wiring in the first side area; a cathode layer of the organic light-emitting member is electrically connected with a third signal end and a fourth signal end of the integrated circuit by a cathode wiring in the first side area, the output signal of each of the first signal end and the second signal end is a cathode signal; the cathode wiring, the connection wiring, and the source-drain metallic layer are made in a same film layer.

15. The organic light-emitting display panel according to claim 4, wherein each of the second side area and the fourth side area is provided with one gate drive circuit, the gate drive circuit is located at a side of an area occupied by the first buffer layer, the first insulation layer, and the second insulation layer in the respective second or fourth side area close to the display area.

16. The organic light-emitting display panel according to claim 15, wherein a distance between the antistatic ring and each of the gate drive circuits is greater than or equal to 100 µm.

17. The organic light-emitting display panel according to claim 15, wherein the first side area is further provided with two groups of testing wirings, each of the two groups of testing wirings is electrically connected with one of the gate drive circuits; and the two groups of testing wirings are located at a side of the antistatic ring which is nearer to the display area.

18. The organic light-emitting display panel according to claim 1, wherein a material of each of the first buffer layer, the first insulation layer, and the second insulation layer comprises silicon oxide or silicon nitride.

19. An organic light-emitting display device, comprising an organic light-emitting display panel, wherein the organic light-emitting display panel comprising:
an array substrate;
an organic light-emitting member placed on the array substrate; and
an encapsulation layer placed on a side of the organic light-emitting member away from the array substrate and covering the organic light-emitting member;
wherein the array substrate comprises a flexible substrate, and the flexible substrate comprises a display area and a non-display area surrounding the display area;
the array substrate further comprises a first buffer layer, a first insulation layer, a second insulation layer, and an antistatic ring, wherein the first buffer layer, the first insulation layer, and the second insulation layer are sequentially placed in the non-display area along a direction away from flexible substrate, the antistatic ring is placed between the first buffer layer and the first insulation layer, an extending direction of the antistatic ring is a circumferential direction of the non-display area, and the antistatic ring is non-closed in the extending direction;

the array substrate further comprises a second buffer layer, a polysilicon layer, a gate insulation layer, a gate metallic layer, a third insulation layer, a capacitor metallic layer, a fourth insulation layer, a source-drain metallic layer, and a planarization layer, wherein the second buffer layer, the polysilicon layer, the gate insulation layer, the gate metallic layer, the third insulation layer, the capacitor metallic layer, the fourth insulation layer, the source-drain metallic layer, and the planarization layer are sequentially placed in the display area of the flexible substrate along a direction toward the organic light-emitting member; and wherein the second buffer layer and the first buffer layer are made in a same process, the third insulation layer and the first insulation layer are made in a same process, the fourth insulation layer and the second insulation layer are made in a same process, and the antistatic ring and the gate metallic layer are made in a same process.

20. A method for making an organic light-emitting display panel, comprising steps of:

making an array substrate;

forming a plurality of organic light-emitting members on the array substrate made; and making a encapsulation layer, wherein the encapsulation layer is placed at a side of the plurality of organic light-emitting members away from the array substrate and covers the plurality of organic light-emitting members;

wherein the step of making the array substrate comprises steps of:

providing a flexible substrate, wherein the flexible substrate comprises a display area and a non-display area surrounding the display area;

sequentially forming a first buffer layer, an antistatic ring, a first insulation layer, and a second insulation layer in the non-display area of the flexible substrate, wherein an extending direction of the antistatic ring is a circumferential direction of the non-display area, and the antistatic ring is non-closed in the extending direction; and sequentially forming a second buffer layer, a polysilicon layer, a gate insulation layer, a gate metallic layer, a third insulation layer, a capacitor metallic layer, a fourth insulation layer, a source-drain metallic layer, and a planarization layer in the display area of the flexible substrate; and wherein the second buffer layer and the first buffer layer are made in a same process, the third insulation layer and the first insulation layer are made in a same process, the fourth insulation layer and the second insulation layer are made in a same process, and the antistatic ring and the gate metallic layer are made in a same process.

* * * * *